(12) United States Patent
Takahashi et al.

(10) Patent No.: US 11,296,701 B2
(45) Date of Patent: Apr. 5, 2022

(54) SINGLE-POLARITY LEVEL SHIFTER CIRCUIT AND SEMICONDUCTOR DEVICE

(71) Applicant: Semiconductor Energy Laboratory Co., Ltd., Atsugi (JP)

(72) Inventors: Kei Takahashi, Isehara (JP); Yuki Okamoto, Isehara (JP); Takahiko Ishizu, Sagamihara (JP); Minato Ito, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/286,094

(22) PCT Filed: Oct. 16, 2019

(86) PCT No.: PCT/IB2019/058800
§ 371 (c)(1),
(2) Date: Apr. 16, 2021

(87) PCT Pub. No.: WO2020/084399
PCT Pub. Date: Apr. 30, 2020

(65) Prior Publication Data
US 2021/0384906 A1 Dec. 9, 2021

(30) Foreign Application Priority Data
Oct. 25, 2018 (JP) .............................. JP2018-201033

(51) Int. Cl.
*H03K 19/018* (2006.01)
*H03K 19/0185* (2006.01)

(52) U.S. Cl.
CPC .......................... *H03K 19/018507* (2013.01)

(58) Field of Classification Search
None
See application file for complete search history.

(56) References Cited

U.S. PATENT DOCUMENTS 6,124,732 A * 9/2000 Zilic .............. H03K 19/018585
326/63
8,508,967 B2 8/2013 Yamazaki et al.
(Continued)

FOREIGN PATENT DOCUMENTS

| CN | 103843251 A | 6/2014 |
| CN | 105144584 A | 12/2015 |

(Continued)

OTHER PUBLICATIONS

International Search Report (Application No. PCT/IB2019/058800) dated Feb. 4, 2020.

(Continued)

*Primary Examiner* — Jeffery S Zweizig
(74) *Attorney, Agent, or Firm* — Robinson Intellectual Property Law Office; Eric J. Robinson

(57) ABSTRACT

A semiconductor device capable of level shifting in a negative potential direction using an n-channel transistor is provided. The semiconductor device includes a first source follower, a second source follower, and a comparator. The first source follower is supplied with a second high power supply potential and a low power supply potential; the second source follower is supplied with a first high power supply potential and the low power supply potential; and a digital signal which expresses a high level or a low level using the second high power supply potential or the first high power supply potential is input to the first source follower.

(Continued)

Here, the second high power supply potential is a potential higher than the first high power supply potential, and the first high power supply potential is a potential higher than the low power supply potential. The comparator compares output potentials of the first source follower and the second source follower and outputs a digital signal which expresses a high level or a low level using the first high power supply potential or the low power supply potential.

9 Claims, 15 Drawing Sheets

(56) References Cited

U.S. PATENT DOCUMENTS

| | | | |
|---|---|---|---|
| 8,587,366 B2 * | 11/2013 | Im | G11C 11/4074 327/536 |
| 8,957,721 B2 | 2/2015 | Kihara et al. | |
| 9,264,022 B2 | 2/2016 | Kihara | |
| 2014/0347116 A1 | 11/2014 | Kihara et al. | |
| 2015/0358003 A1 | 12/2015 | Kihara | |

FOREIGN PATENT DOCUMENTS

| | | |
|---|---|---|
| EP | 2763320 A | 8/2014 |
| JP | 2012-256820 A | 12/2012 |
| TW | 201315150 | 4/2013 |
| WO | WO-2013/046898 | 4/2013 |
| WO | WO-2014/171190 | 10/2014 |

OTHER PUBLICATIONS

Written Opinion (Application No. PCT/IB2019/058800) dated Feb. 4, 2020.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

* cited by examiner

100

50

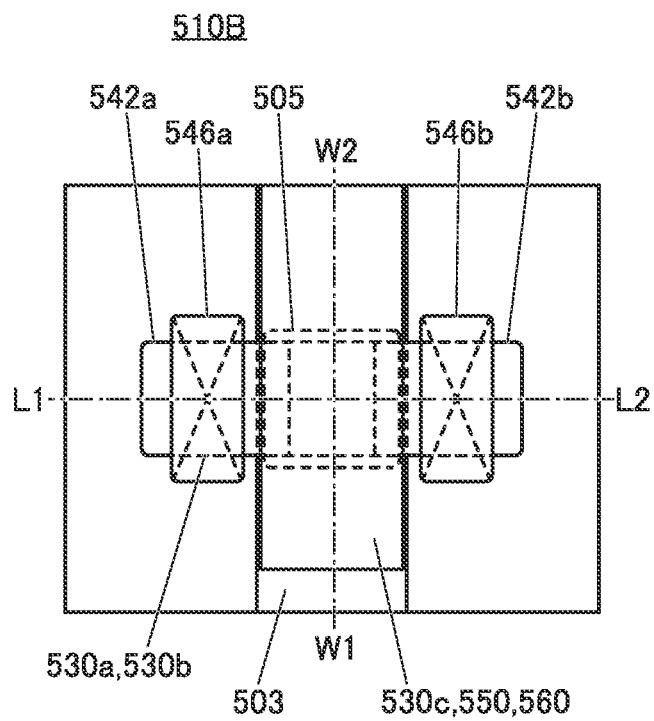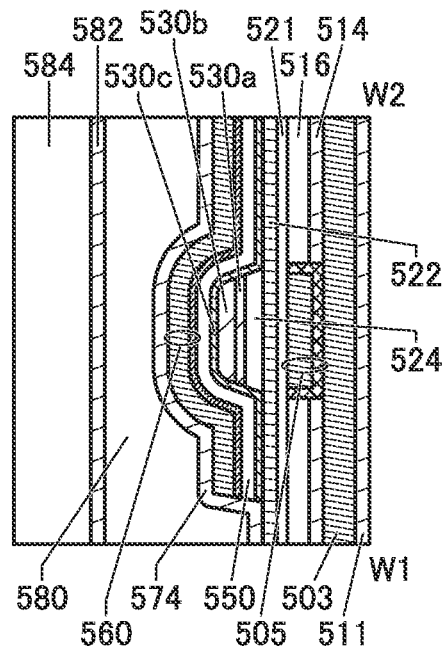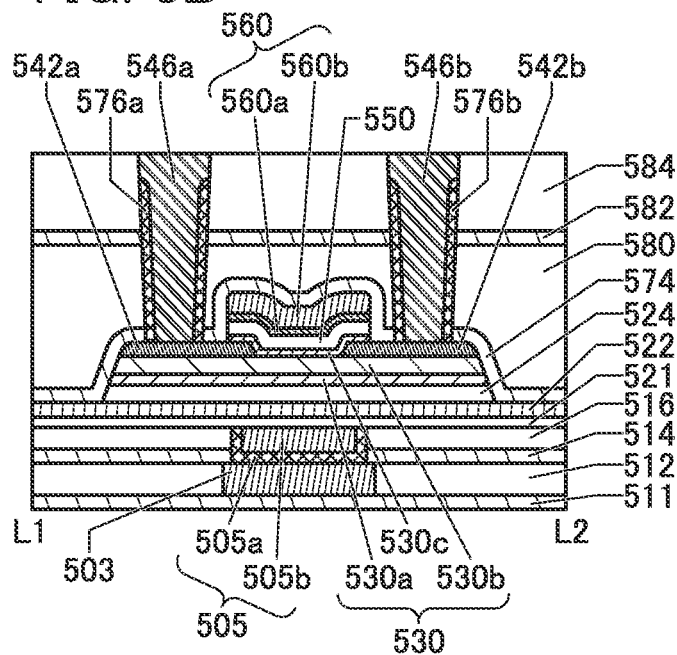

US 11,296,701 B2

SINGLE-POLARITY LEVEL SHIFTER CIRCUIT AND SEMICONDUCTOR DEVICE

TECHNICAL FIELD

One embodiment of the present invention relates to a level shifter circuit formed using a single-polarity transistor.

One embodiment of the present invention relates to a semiconductor device. Note that in this specification and the like, a semiconductor device refers to all devices that can function by utilizing semiconductor characteristics. For example, an integrated circuit, a chip including an integrated circuit, an electronic component including a packaged chip, and an electronic device including an integrated circuit are examples of a semiconductor device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

BACKGROUND ART

A circuit that processes a digital signal which is expressed by a high level or a low level (sometimes denoted by High or Low, H or L, 1 or 0, or the like) (also referred to as a digital circuit) is widely used. In many cases, a high power supply potential and a low power supply potential are supplied to a digital circuit; the high power supply potential is used for expressing a high level and the low power supply potential is used for expressing a low level.

Here, in the case of performing digital signal communication between a first circuit and a second circuit which have different high-level potentials or different low-level potentials (or both of them), the high-level potential or the low-level potential (or both of them) needs to be changed. In this case, a level shifter circuit (also referred to as a level shifter or a level converter circuit) is used.

Meanwhile, a transistor including a metal oxide in a channel formation region (also referred to as an oxide semiconductor transistor or an OS transistor) has been attracting attention in recent years. As the OS transistor, an n-channel transistor has been in practical use, and for example, the OS transistor has the following features: it has extremely low off-state current; a high voltage (also referred to as a potential difference) can be applied between a source and a drain (that is, it has high withstand voltage); and it can be stacked because it is a thin film transistor. Furthermore, the OS transistor has the following features: off-state current is less likely to be increased even in a high-temperature environment; and the ratio of on-state current to off-state current is high even in a high-temperature environment, and thus a semiconductor device formed using an OS transistor has high reliability.

For example, Patent Document 1 discloses a semiconductor device including a plurality of memory cells using OS transistors over a semiconductor substrate where peripheral circuits such as a driver circuit and a control circuit are formed, and an example in which an OS transistor is used in a memory cell of a DRAM (Dynamic Random Access Memory). For example, a peripheral circuit can be formed using a Si transistor formed on a single crystal silicon substrate and a memory cell using an OS transistor can be stacked thereabove. The memory cell using an OS transistor is provided over the single crystal silicon substrate on which the peripheral circuit is formed, whereby the following features are obtained: the chip area can be reduced; and stored data can be retained for a long time because the OS transistor has extremely low off-state current.

In addition, not only single-component metal oxides, such as indium oxide and zinc oxide, but also multi-component metal oxides are known as oxide semiconductors, for example. Among the multi-component metal oxides, in particular, an In—Ga—Zn oxide (also referred to as IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3).

Non-Patent Document 1 and Non-Patent Document 2 disclose a technique for fabricating a transistor using an oxide semiconductor having a CAAC structure. Moreover, Non-Patent Document 4 and Non-Patent Document 5 disclose that a fine crystal is included even in an oxide semiconductor which has lower crystallinity than an oxide semiconductor having the CAAC structure or the nc structure.

Non-Patent Document 6 reports the extremely low off-state current of a transistor using an oxide semiconductor, and Non-Patent Document 7 and Non-Patent Document 8 report an LSI (Large Scale Integration) and a display which utilize such a property of extremely low off-state current.

REFERENCE

Patent Document

[Patent Document 1] Japanese Published Patent Application No. 2012-256820

Non-Patent Document

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

In the case where the above level shifter circuit is formed using a single-polarity transistor, for example, in the case where the above level shifter circuit is formed using an n-channel transistor, the n-channel transistor operates on the basis of a lower potential of potentials of a source and a drain; therefore, there has been a problem in that level shifting in a negative potential direction is particularly difficult.

Furthermore, a level shifter circuit that uses an n-channel transistor and performs level shifting in a negative potential direction can be achieved using capacitive coupling; however, there has been a problem in that it is susceptible to noise and cannot respond to a change in a potential to be level-shifted after the potential is level-shifted.

An object of one embodiment of the present invention is to provide a semiconductor device capable of level shifting using a single-polarity transistor. Another object of one embodiment of the present invention is to provide a semiconductor device capable of level shifting in a negative potential direction using an n-channel transistor.

Note that one embodiment of the present invention does not necessarily achieve all the above objects and only needs to achieve at least one of the objects. The descriptions of the above objects do not preclude the existence of other objects. Objects other than these will be apparent from the description of the specification, the claims, the drawings, and the like, and objects other than these can be derived from the description of the specification, the claims, the drawings, and the like.

Means for Solving the Problems

One embodiment of the present invention is a semiconductor device including a first source follower, a second source follower, and a comparator. The first source follower is supplied with a second high power supply potential and a low power supply potential; the second source follower is supplied with a first high power supply potential and the low power supply potential; and the comparator is supplied with the first high power supply potential and the low power supply potential. The first high power supply potential is a potential higher than the low power supply potential; the second high power supply potential is a potential higher than the first high power supply potential; a digital signal which expresses a high level or a low level using the second high power supply potential or the first high power supply potential is input to the first source follower. The comparator compares an output potential of the first source follower and an output potential of the second source follower and outputs a digital signal which expresses a high level or a low level using the first high power supply potential or the low power supply potential.

Another embodiment of the present invention is a semiconductor device including a first source follower, a second source follower, and a comparator. The first source follower is supplied with a second high power supply potential and a low power supply potential; the second source follower is supplied with a first high power supply potential and the low power supply potential; and the comparator is supplied with the first high power supply potential and the low power supply potential. The first high power supply potential is a potential higher than the low power supply potential; the second high power supply potential is a potential higher than the first high power supply potential; a digital signal which expresses a high level or a low level using the second high power supply potential or the first high power supply potential is input to the first source follower. In the case where an output potential of the first source follower is higher than an output potential of the second source follower, the comparator outputs the first high power supply potential, and in the case where the output potential of the first source follower is lower than the output potential of the second source follower, the comparator outputs the low power supply potential.

Another embodiment of the present invention is a semiconductor device including a first source follower, a second source follower, and a comparator. The first source follower is supplied with a second high power supply potential and a low power supply potential; the second source follower is supplied with a first high power supply potential and the low power supply potential; and the comparator is supplied with the first high power supply potential and the low power supply potential. The first high power supply potential is a potential higher than the low power supply potential; the second high power supply potential is a potential higher than the first high power supply potential; a digital signal which expresses a high level or a low level using the second high power supply potential or the first high power supply potential is input to the first source follower. A predetermined potential is input to the second source follower; in the case where an output potential of the first source follower is higher than an output potential of the second source follower, the comparator outputs the first high power supply potential; and in the case where the output potential of the first source follower is lower than the output potential of the second source follower, the comparator outputs the low power supply potential.

In the above embodiment, each of a transistor included in the first source follower, a transistor included in the second source follower, and a transistor included in the comparator is an n-channel transistor.

In the above embodiment, each of a transistor included in the first source follower, a transistor included in the second source follower, and a transistor included in the comparator includes a metal oxide in a channel formation region.

Effect of the Invention

According to one embodiment of the present invention, a semiconductor device capable of level shifting using a single-polarity transistor can be provided. According to another embodiment of the present invention, a semiconductor device capable of level shifting in a negative potential direction using an n-channel transistor can be provided.

Note that the description of the effects does not preclude the existence of other effects. One embodiment of the present invention does not necessarily have all the effects. Effects other than these will be apparent from the descriptions of the specification, the claims, the drawings, and the like, and effects other than these can be derived from the descriptions of the specification, the claims, the drawings, and the like.

BRIEF DESCRIPTION OF THE DRAWINGS

FIG. 8A is a top view illustrating a structure example of a transistor. FIG. 8B and FIG. 8C are cross-sectional views illustrating the structure example of the transistor.

MODE FOR CARRYING OUT THE INVENTION

Figure 1A:
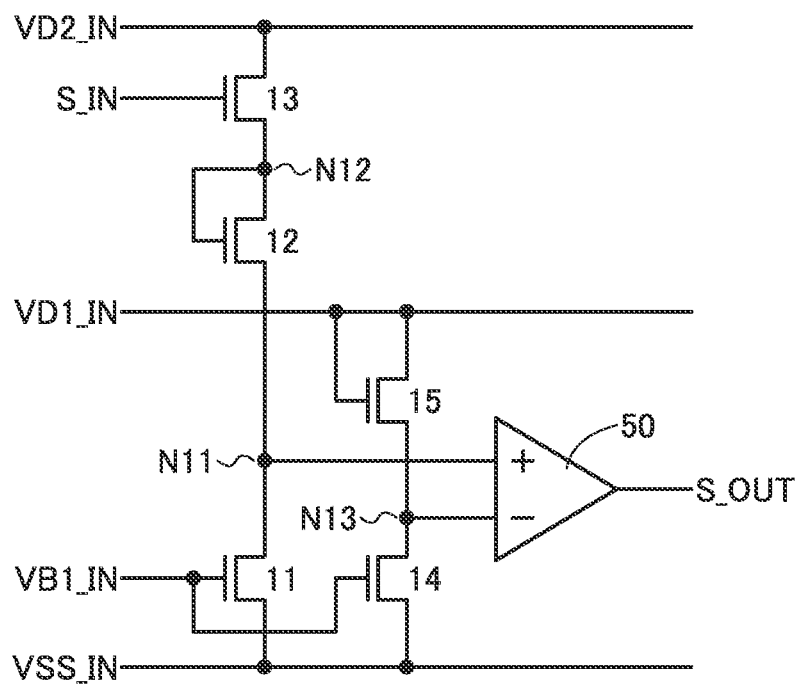
FIG. 1A is a circuit diagram illustrating a structure example of a semiconductor device.

Hereinafter, embodiments will be described with reference to the drawings. However, the embodiments can be implemented with many different modes, and it will be readily appreciated by those skilled in the art that modes and details thereof can be changed in various ways without departing from the spirit and scope thereof. Thus, the present invention should not be construed as being limited to the following description of the embodiments.

A plurality of embodiments described below can be combined as appropriate. In addition, in the case where a plurality of structure examples are described in one embodiment, the structure examples can be combined as appropriate.

Note that in the drawings attached to this specification, the block diagram in which components are classified according to their functions and shown as independent blocks is illustrated; however, it is difficult to separate actual components completely according to their functions, and it is possible for one component to relate to a plurality of functions.

In the drawings and the like, the size, the layer thickness, the region, or the like is exaggerated for clarity in some cases. Therefore, they are not limited to the illustrated scale. The drawings schematically show ideal examples, and shapes, values, or the like are not limited to shapes, values, or the like shown in the drawings.

In the drawings and the like, the same elements, elements having similar functions, elements formed of the same material, elements formed at the same time, or the like are sometimes denoted by the same reference numerals, and description thereof is not repeated in some cases.

Moreover, in this specification and the like, the term "film" and the term "layer" can be interchanged with each other. For example, the term "conductive layer" can be changed into the term "conductive film" in some cases. As another example, the term "insulating film" can be changed into the term "insulating layer" in some cases.

In this specification and the like, the terms for describing arrangement such as "over" and "below" do not necessarily mean "directly over" and "directly below", respectively, in the positional relationship between components. For example, the expression "a gate electrode over a gate insulating layer" does not exclude the case where there is an additional component between the gate insulating layer and the gate electrode.

In this specification and the like, ordinal numbers such as "first", "second", and "third" are used in order to avoid confusion among components, and the terms do not limit the components numerically.

In this specification and the like, "electrically connected" includes the case where connection is made through an "object having any electric function". There is no particular limitation on the "object having any electric function" as long as electric signals can be transmitted and received between components that are connected through the object. Examples of the "object having any electric function" include a switching element such as a transistor, a resistor, an inductor, a capacitor, and other elements with a variety of functions as well as an electrode and a wiring.

In this specification and the like, "voltage" often refers to a potential difference between a given potential and a reference potential (e.g., a ground potential). Thus, a voltage and a potential difference can be interchanged with each other.

In this specification and the like, a transistor is an element having at least three terminals including a gate, a drain, and a source. A channel formation region is included between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Thus, the terms of a source and a drain are interchangeable for use in this specification and the like.

Furthermore, unless otherwise specified, off-state current in this specification and the like refers to drain current of a transistor in an off state (also referred to as a non-conducting state or a cutoff state). Unless otherwise specified, the off state of an n-channel transistor refers to a state where voltage Vgs of a gate with respect to a source is lower than a threshold voltage Vth, and the off state of a p-channel transistor refers to a state where the voltage Vgs of a gate with respect to a source is higher than the threshold voltage Vth. That is, the off-state current of an n-channel transistor sometimes refers to drain current at the time when the voltage Vgs of a gate with respect to a source is lower than the threshold voltage Vth.

In the above description of the off-state current, the drain may be replaced with the source. That is, the off-state current sometimes refers to source current when a transistor in an off state. In addition, leakage current sometimes expresses the same meaning as off-state current. Furthermore, in this specification and the like, the off-state current sometimes refers to current that flows between a source and a drain when a transistor is in an off state.

In this specification and the like, a metal oxide means an oxide of metal in a broad sense. Metal oxides are classified into an oxide insulator, an oxide conductor (including a transparent oxide conductor), an oxide semiconductor, and the like.

For example, in the case where a metal oxide is used in a channel formation region of a transistor, the metal oxide is called an oxide semiconductor in some cases. That is, in the case where a metal oxide has at least one of an amplifying function, a rectifying function, and a switching function, the metal oxide can be called a metal oxide semiconductor. In other words, a transistor containing a metal oxide in a channel formation region can be referred to as an "oxide semiconductor transistor" or an "OS transistor". Similarly, the "transistor using an oxide semiconductor" described above is also a transistor containing a metal oxide in a channel formation region.

Furthermore, in this specification and the like, a metal oxide containing nitrogen is also referred to as a metal oxide in some cases. A metal oxide containing nitrogen may be referred to as a metal oxynitride. The details of a metal oxide will be described later.

Embodiment 1

In this embodiment, structure examples of a semiconductor device of one embodiment of the present invention will be described. The semiconductor device of one embodiment of the present invention is formed using an n-channel transistor and has a function of a level shifter circuit that changes a high-level potential or a low-level potential (or both of them) of an input digital signal. The semiconductor device of one embodiment of the present invention has a function of level-shifting a potential of an input digital signal in a negative potential direction (a low potential direction).

<Structure Example of Semiconductor Device>

FIG. 1A is a circuit diagram illustrating a structure example of a semiconductor device 100. The semiconductor device 100 includes a transistor 11 to a transistor 15 and a comparator 50. The transistor 11 to the transistor 15 are n-channel transistors and the comparator 50 is formed using an n-channel transistor. Note that in the drawings described in this specification and the like, the flow of main signals is indicated by an arrow or a line, and a power supply line and the like are omitted in some cases.

The semiconductor device 100 includes a wiring VSS_IN supplied with a low power supply potential VSS, a wiring VD1_IN supplied with a first high power supply potential VD1, a wiring VD2_IN supplied with a second high power supply potential VD2, a wiring VB1_IN supplied with a predetermined potential, an input terminal S_IN, and an output terminal S_OUT.

Here, the first high power supply potential VD1 is a potential higher than the low power supply potential VSS, and the second high power supply potential VD2 is a potential higher than the first high power supply potential VD1. Note that the low power supply potential VSS may be a reference potential in the semiconductor device 100.

A digital signal is input to the input terminal S_IN; of the digital signal input to the input terminal S_IN, a high-level potential is the second high power supply potential VD2 and a low-level potential is the first high power supply potential VD1.

In the semiconductor device 100, one of a source and a drain of the transistor 11 is electrically connected to the wiring VSS_IN, the other of the source and the drain of the transistor 11 is electrically connected to one of a source and a drain of the transistor 12 and a non-inverting input terminal (denoted by "+" in FIG. 1A) of the comparator 50, and a gate of the transistor 11 is electrically connected to the wiring VB1_IN and a gate of the transistor 14.

The other of the source and the drain of the transistor 12 is electrically connected to a gate of the transistor 12 and one of a source and a drain of the transistor 13, the other of the source and the drain of the transistor 13 is electrically connected to the wiring VD2_IN, and a gate of the transistor 13 is electrically connected to the input terminal S_IN.

One of a source and a drain of the transistor 14 is electrically connected to the wiring VSS_IN, and the other of the source and the drain of the transistor 14 is electrically connected to one of a source and a drain of the transistor 15 and an inverting input terminal (denoted by "−" in FIG. 1A) of the comparator 50. The other of the source and the drain of the transistor 15 and a gate of the transistor 15 are electrically connected to the wiring VD1_IN. An output terminal of the comparator 50 is electrically connected to the output terminal S_OUT.

The transistor 11 to the transistor 13 form a first source follower, and the transistor 14 and the transistor 15 form a second source follower.

Here, a connection portion of the other of the source and the drain of the transistor 11, the one of the source and the drain of the transistor 12, and the non-inverting input terminal of the comparator 50 is referred to as anode N11; a connection portion of the other of the source and the drain of the transistor 12, the gate of the transistor 12, and the one of the source and the drain of the transistor 13 is referred to as node N12; and a connection portion of the other of the source and the drain of the transistor 14, the one of the source and the drain of the transistor 15, and the inverting input terminal of the comparator 50 is referred to as a node N13.

<Structure Example of Comparator>

Next, a structure example of the comparator 50 will be described. The comparator 50 includes the non-inverting input terminal, the inverting input terminal, and the output terminal. The comparator 50 included in the semiconductor device 100 is formed using an n-channel transistor and has a function of amplifying a difference between potentials input to the non-inverting input terminal and the inverting input terminal. In the case where a potential input to the non-inverting input terminal is higher than a potential input to the inverting input terminal, the comparator 50 performs amplification in a high power supply potential direction and performs output. In the case where a potential input to the non-inverting input terminal is lower than a potential input to the inverting input terminal, the comparator 50 performs amplification in a low power supply potential direction and performs output.

Figure 1B:
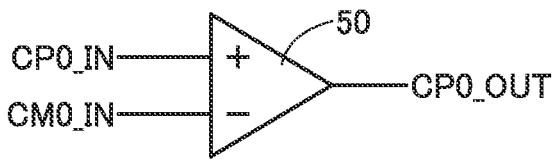
FIG. 1B is a diagram illustrating a symbol of a comparator.

FIG. 1B illustrates a symbol of the comparator 50. Here, as illustrated in FIG. 1B, the non-inverting input terminal of the comparator 50 is referred to as an input terminal CP0_IN, the inverting input terminal thereof is referred to as an input terminal CM0_IN, and the output terminal thereof is referred to as an output terminal CP0_OUT.

Figure 1C:
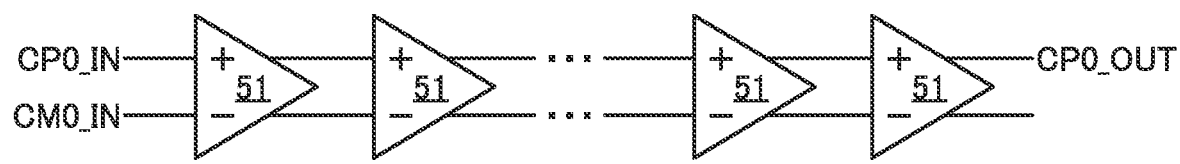
FIG. 1C is a diagram illustrating a structure example of the comparator.

The comparator 50 includes one amplifier 51 or a plurality of amplifiers 51 connected in series. FIG. 1C illustrates a structure example in which the comparator 50 includes the plurality of amplifiers 51.

Figure 2A:
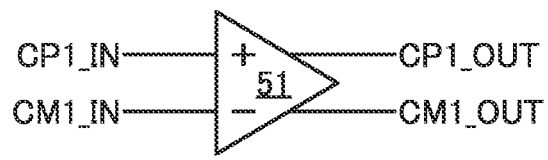
FIG. 2A is a diagram illustrating a symbol of an amplifier.

The amplifier 51 includes a non-inverting input terminal, an inverting input terminal, a non-inverting output terminal, and an inverting output terminal. FIG. 2A illustrates a symbol of the amplifier 51. Here, as illustrated in FIG. 2A, the non-inverting input terminal of the amplifier 51 is referred to as an input terminal CP1_IN, the inverting input terminal thereof is referred to as an input terminal CM1_IN, the non-inverting output terminal thereof is referred to as an output terminal CP1_OUT, and the inverting output terminal thereof is referred to as an output terminal CM1_OUT.

In FIG. 1C, the input terminal CP0_IN is electrically connected to an input terminal CP1_IN of a first amplifier 51, the input terminal CM0_IN is electrically connected to an input terminal CM1_IN of the first amplifier 51, an output terminal CP1_OUT of the first amplifier 51 is electrically connected to an input terminal CP1_IN of a second amplifier 51, and an output terminal CM1_OUT of the first amplifier 51 is electrically connected to an input terminal CM1_IN of the second amplifier 51.

Among the plurality of amplifiers 51, an output terminal CP1_OUT of a last amplifier 51 is electrically connected to the output terminal CP0_OUT. The number of the amplifiers 51 can be determined by comparison of the amplification factor required for the comparator 50 with the amplification factor of one amplifier 51.

Figure 2B:
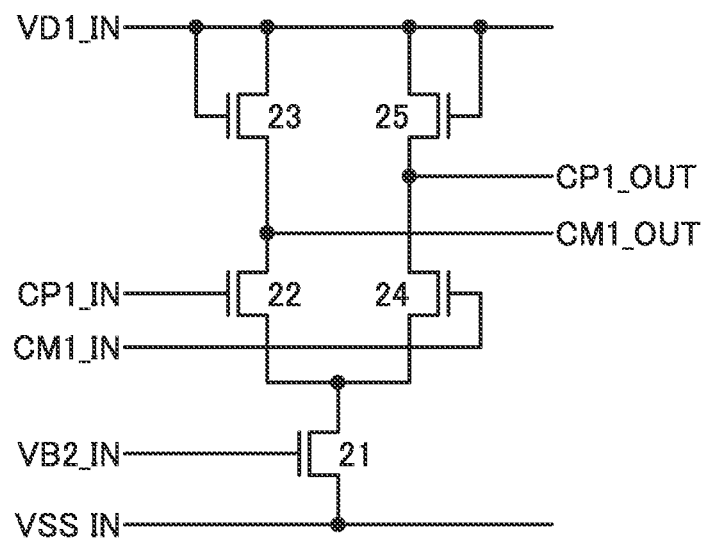
FIG. 2B and FIG. 2C are circuit diagrams illustrating structure examples of the amplifier.

FIG. 2B is a circuit diagram illustrating a structure example of the amplifier 51. The amplifier 51 includes a transistor 21 to a transistor 25. Note that the transistor 21 to the transistor 25 are n-channel transistors.

The amplifier 51 includes the wiring VSS_IN supplied with the low power supply potential VSS, the wiring VD1_IN supplied with the first high power supply potential VD1, a wiring VB2_IN supplied with a predetermined potential, the input terminal CP1_IN, the input terminal CM1_IN, the output terminal CP1_OUT, and the output terminal CM1_OUT.

In the amplifier 51, one of a source and a drain of the transistor 21 is electrically connected to the wiring VSS_IN; the other of the source and the drain of the transistor 21 is electrically connected to one of a source and a drain of the transistor 22 and one of a source and a drain of the transistor 24; and a gate of the transistor 21 is electrically connected to the wiring VB2_IN.

The other of the source and the drain of the transistor 22 is electrically connected to one of a source and a drain of the transistor 23 and the output terminal CM1_OUT; the other of the source and the drain of the transistor 23 and a gate of the transistor 23 are electrically connected to the wiring VD1_IN; and a gate of the transistor 22 is electrically connected to the input terminal CP1_IN.

The other of the source and the drain of the transistor 24 is electrically connected to one of a source and a drain of the transistor 25 and the output terminal CP1_OUT; the other of the source and the drain of the transistor 25 and a gate of the transistor 25 are electrically connected to the wiring VD1_IN; and a gate of the transistor 24 is electrically connected to the input terminal CM1_IN.

Figure 2C:
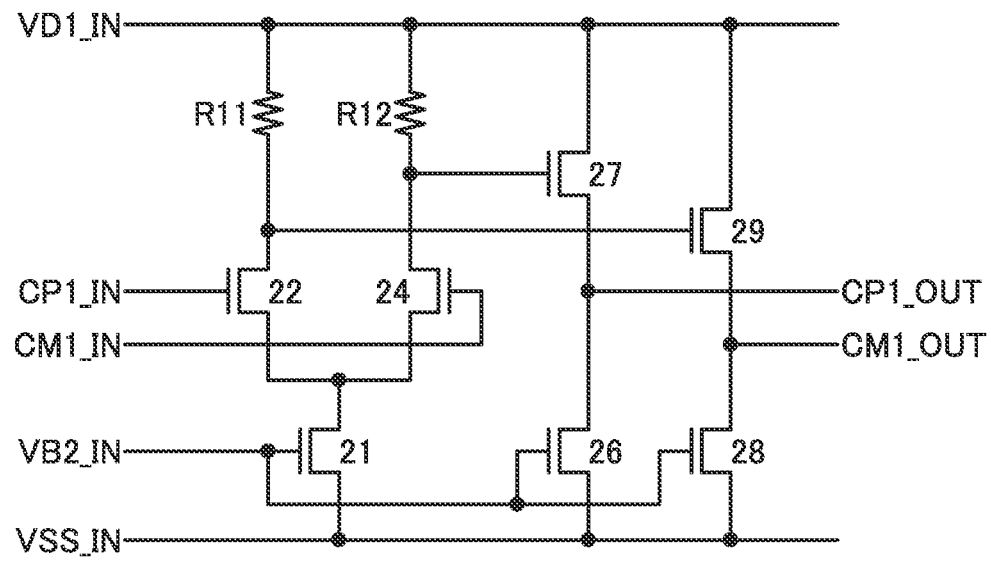

The amplifier 51 may have a structure including a resistor. FIG. 2C is a circuit diagram illustrating a structure example of the amplifier 51 different from that in FIG. 2B. The amplifier 51 illustrated in FIG. 2C includes a resistor R11, a resistor R12, the transistor 21, the transistor 22, the transistor 24, and a transistor 26 to a transistor 29. The transistor 21, the transistor 22, the transistor 24, and the transistor 26 to the transistor 29 are n-channel transistors.

In the amplifier 51 illustrated in FIG. 2C, the one of the source and the drain of the transistor 21 is electrically connected to the wiring VSS_IN; the other of the source and the drain of the transistor 21 is electrically connected to the one of the source and the drain of the transistor 22 and the one of the source and the drain of the transistor 24; and the gate of the transistor 21 is electrically connected to the wiring VB2_IN, a gate of the transistor 26, and a gate of the transistor 28.

The other of the source and the drain of the transistor 22 is electrically connected to one terminal of the resistor R11 and a gate of the transistor 29; the other terminal of the resistor R11 is electrically connected to the wiring VD1_IN; and the gate of the transistor 22 is electrically connected to the input terminal CP1_IN.

The other of the source and the drain of the transistor 24 is electrically connected to one terminal of the resistor R12 and a gate of the transistor 27; the other terminal of the resistor R12 is electrically connected to the wiring VD1_IN; and the gate of the transistor 24 is electrically connected to the input terminal CM1_IN.

One of a source and a drain of the transistor 26 is electrically connected to the wiring VSS_IN; the other of the source and the drain of the transistor 26 is electrically connected to one of a source and a drain of the transistor 27 and the output terminal CP1_OUT; and the other of the source and the drain of the transistor 27 is electrically connected to the wiring VD1_IN.

One of a source and a drain of the transistor 28 is electrically connected to the wiring VSS_IN; the other of the source and the drain of the transistor 28 is electrically connected to one of a source and a drain of the transistor 29 and the output terminal CM1_OUT; and the other of the source and the drain of the transistor 29 is electrically connected to the wiring VD1_IN.

<Operation Example of Semiconductor Device>

Figure 3:
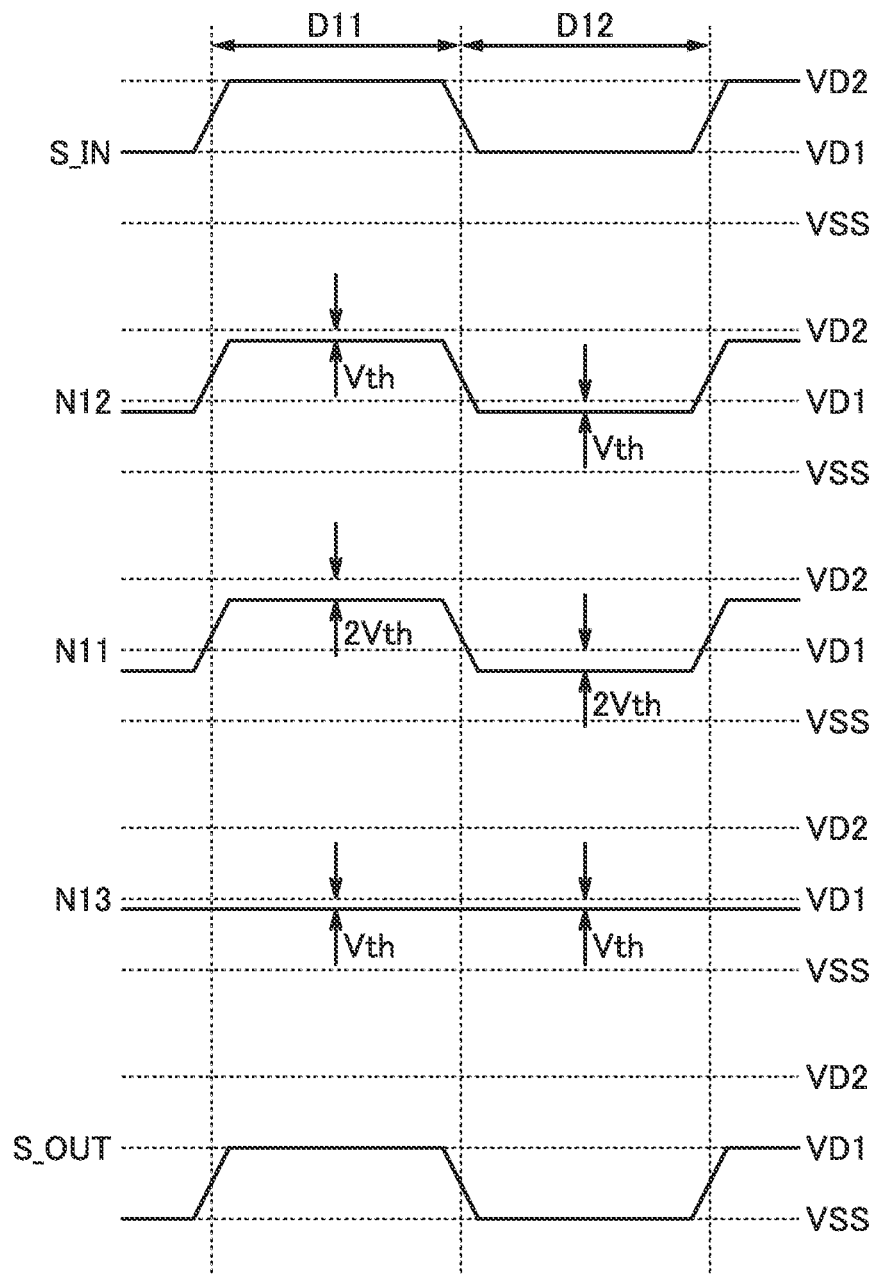
FIG. 3 is a diagram showing potential relationship among an input terminal, nodes, and an output terminal.

FIG. 3 is a diagram showing a potential relation among the input terminal S_IN, the node N11 to the node N13, and the output terminals S_OUT. FIG. 3 shows Period D11 during which the second high power supply potential VD2 which expresses a high level is input to the input terminal S_IN, and Period D12 during which the first high power supply potential VD1 which expresses a low level is input to the input terminal S_IN.

Note that each of the threshold voltages of the transistor 11 to the transistor 15 is a threshold voltage Vth, and a potential difference higher than 2×the threshold voltage Vth is given between the second high power supply potential VD2 and the first high power supply potential VD1 and between the first high power supply potential VD1 and the low power supply potential VSS. The gates of the transistor 11 and the transistor 14 are supplied with a predetermined potential by the wiring VB1_IN; minute current flows through the transistor 11 to the transistor 13 between the wiring VD2_IN and the wiring VSS_IN; and minute current flows through the transistor 14 and the transistor 15 between the wiring VD1_IN and the wiring VSS_IN.

In Period D11, when the second high power supply potential VD2 is applied to the gate of the transistor 13, the potential of the node N12 becomes substantially the same as a potential that is decreased from the second high power supply potential VD2 by the threshold voltage Vth of the transistor 13. That is, the potential of the node N12 is the second high power supply potential VD2−the threshold voltage Vth. The potential of the node N11 becomes substantially the same as a potential that is decreased from the potential of the node N12 by the threshold voltage Vth of the transistor 12. That is, the potential of the node N11 is the second high power supply potential VD2−2×the threshold voltage Vth. The potential of the node N13 becomes substantially the same as a potential that is decreased from the first high power supply potential VD1 by the threshold voltage Vth of the transistor 15. The potential of the node N13 is the first high power supply potential VD1−the threshold voltage Vth.

In this time, the comparator 50 compares the potential of the node N11 input to the non-inverting input terminal with the potential of the node N13 input to the inverting input terminal and outputs the first high power supply potential VD1 because the potential of the node N11 is higher. That is, the potential of the output terminal S_OUT is the first high power supply potential VD1.

Similarly, in Period D12, when the first high power supply potential VD1 is applied to the gate of the transistor 13, the potential of the node N12 becomes substantially the same as a potential that is decreased from the first high power supply potential VD1 by the threshold voltage Vth of the transistor 13. That is, the potential of the node N12 is the first high power supply potential VD1−the threshold voltage Vth. The potential of the node N11 becomes substantially the same as a potential that is decreased from the potential of the node N12 by the threshold voltage Vth of the transistor 12. That is, the potential of the node N11 is the first high power supply potential VD1−2×the threshold voltage Vth. The potential of the node N13 becomes substantially the same as a potential that is decreased from the first high power supply potential VD1 by the threshold voltage Vth of the transistor 15. The potential of the node N13 is the first high power supply potential VD1−the threshold voltage Vth.

In this time, the comparator 50 compares the potential of the node N11 input to the non-inverting input terminal with the potential of the node N13 input to the inverting input terminal and outputs the low power supply potential VSS because the potential of the node N13 is higher. That is, the potential of the output terminal S_OUT is the low power supply potential VSS.

That is, the semiconductor device 100 outputs the first high power supply potential VD1 from the output terminal S_OUT when the second high power supply potential VD2 which expresses a high level is input to the input terminal S_IN, and outputs the low power supply potential VSS from the output terminal S_OUT when the first high power supply potential VD1 which expresses a low level is input to the input terminal S_IN. The semiconductor device 100 has a function of a level shifter circuit that changes the second high power supply potential VD2 which expresses a high level to the first high power supply potential VD1 and changes the first high power supply potential VD1 which expresses a low level to the low power supply potential VSS.

In the case where potential differences given between the second high power supply potential VD2 and the first high power supply potential VD1 and between the first high power supply potential VD1 and the low power supply potential VSS are sufficiently large, the transistors 12 may be increased in number and connected in series. A difference between potentials of the node N11 and the node N13 compared by the comparator 50 can be increased, and thus the amplification factor required for the comparator 50 can be reduced.

<Transistor Included in Semiconductor Device>

As each of the transistor 11 to the transistor 15 included in the semiconductor device 100 and the transistors included in the comparator 50, a transistor including a metal oxide in a channel formation region (OS transistor) can be used.

For example, the OS transistor has the following features: it has extremely low off-state current, a high voltage can be applied between a source and a drain, and it can be stacked because it is a thin film transistor. Here, off-state current refers to drain current when a transistor is in an off state. An oxide semiconductor has a bandgap of 2.5 eV or larger, preferably 3.0 eV or larger; thus, an OS transistor has characteristics of low leakage current due to thermal excitation and extremely low off-state current. An off-state current per micrometer of channel width of an OS transistor can be, for example, lower than or equal to 100 zA/μm, lower than or equal to 10 zA/μm, lower than or equal to 1 zA/μm, or lower than or equal to 10 yA/μm.

Furthermore, an OS transistor has the following features: off-state current is less likely to be increased even in a high-temperature environment, and the ratio of on-state current to off-state current is high even in a high-temperature environment. The semiconductor device 100 is formed using an OS transistor, whereby the reliability of the semiconductor device 100 can be increased.

A metal oxide used in a channel formation region of the OS transistor is preferably an oxide semiconductor containing at least one of indium (In) and zinc (Zn). Typical examples of such an oxide semiconductor include an In-M-Zn oxide (an element M is Al, Ga, Y, or Sn, for example). Reducing both impurities serving as electron donors, such as moisture or hydrogen, and oxygen vacancies can make an oxide semiconductor i-type (intrinsic) or substantially i-type. Such an oxide semiconductor can be referred to as a highly purified oxide semiconductor. Note that the details of an OS transistor will be described in Embodiment 2 and Embodiment 3.

Moreover, an OS transistor is a thin film transistor and thus can be stacked to be provided. For example, an OS transistor can be provided over a circuit formed using a Si transistor formed on a single crystal silicon substrate. Thus, the chip area of the semiconductor device 100 can be reduced.

Alternatively, as each of the transistor 11 to the transistor 15 included in the semiconductor device 100 and the transistors included in the comparator 50, a transistor other than an OS transistor may be used. For example, a transistor including a semiconductor with a wide bandgap in a channel formation region can be used. The semiconductor with a wide bandgap refers to a semiconductor whose bandgap is higher than or equal to 2.2 eV in some cases, and examples thereof include silicon carbide, gallium nitride, and diamond.

<Application Example of Semiconductor Device>

An application example of the semiconductor device 100 will be described. The semiconductor device 100 can be used for forming an anomaly detection circuit in an assembled battery where secondary batteries are connected in series.

Figure 4A:
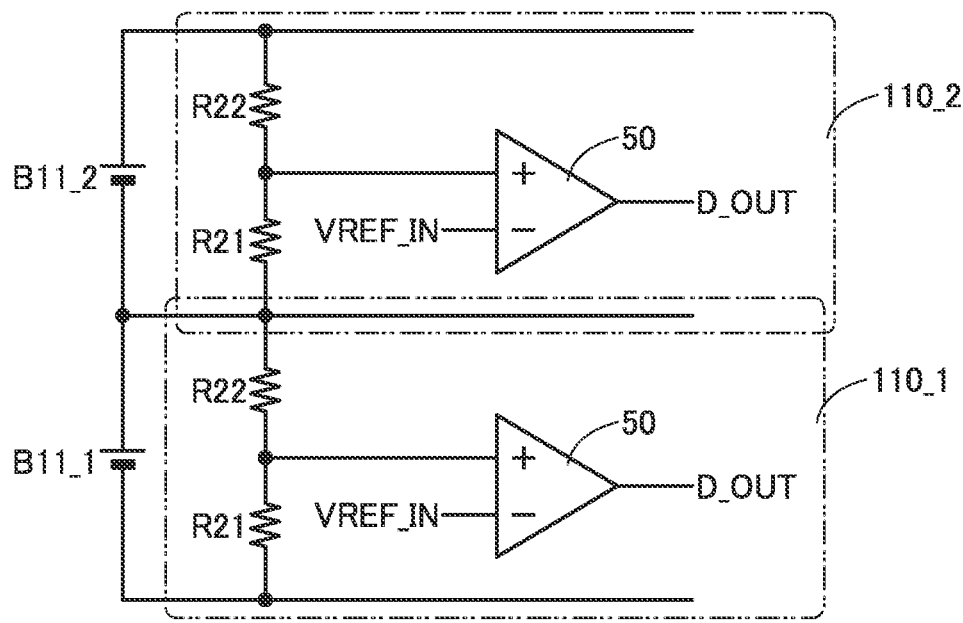
FIG. 4A is a diagram illustrating a structure example of a secondary battery and an anomaly detection circuit.

FIG. 4A is a diagram illustrating a structure example of a secondary battery B11 and an anomaly detection circuit 110. Note that FIG. 4A illustrates an example in which two secondary batteries B11 are connected in series, and the secondary batteries B11 are denoted by reference numerals such as "_1" and "_2" in order to distinguish a plurality of components. Note that description will be made using the reference numeral of the secondary battery B11 when a given secondary battery is referred. The same applies to the anomaly detection circuit 110.

FIG. 4A illustrates a secondary battery B11_1, a secondary battery B11_2, an anomaly detection circuit 110_1, and an anomaly detection circuit 110_2. The secondary battery B11_1 is electrically connected to the anomaly detection circuit 110_1, and the secondary battery B11_2 is electrically connected to the anomaly detection circuit 110_2.

Note that examples of a secondary battery that can be used as the secondary battery B11 include a lithium ion secondary battery, a nickel hydrogen battery, and an all-solid-state battery.

The anomaly detection circuit 110 has a function of monitoring a potential difference between a positive electrode and a negative electrode of the secondary battery B11 and outputting an anomaly detection signal in the case where the potential difference between the positive electrode and the negative electrode exceeds a predetermined potential difference. The anomaly detection circuit 110 includes a resistor R21, a resistor R22, the comparator 50, and an output terminal D_OUT.

One terminal of the resistor R21 is electrically connected to the negative electrode of the secondary battery B11, the other terminal of the resistor R21 is electrically connected to one terminal of the resistor R22 and the non-inverting input terminal of the comparator 50 (denoted by "+" in FIG. 4A), and the other terminal of the resistor R22 is electrically connected to the positive electrode of the secondary battery B11. The inverting input terminal of the comparator 50 (denoted by "−" in FIG. 4A) is electrically connected to a wiring VREF_IN supplied with a predetermined potential VREF.

In the case where the potential difference between the positive electrode and the negative electrode of the secondary battery B11 is denoted by a potential difference VC, and the resistance values of the resistor R21 and the resistor R22 are denoted by the respective reference numerals, when a value obtained by VC×R21÷(R21+R22) becomes larger than the predetermined potential VREF, the comparator 50 outputs a high-level potential. That is, the anomaly detection circuit 110 outputs an anomaly detection signal from the output terminal D_OUT.

Here, when the potential of the negative electrode of the secondary battery B11_1 is the low power supply potential VSS, the potential of the positive electrode of the secondary battery B11_1 and the potential of the negative electrode of the secondary battery B11_2 are VSS+VC, and the potential of the positive electrode of the secondary battery B11_2 is VSS+2×VC. The comparator 50 included in the anomaly detection circuit 110_1 operates using the low power supply potential VSS and the potential (VSS+VC) as a power supply, and the comparator 50 included in the anomaly detection circuit 110_2 operates using the potential (VSS+VC) and the potential (VSS+2×VC) as a power supply. That is, a high-level potential for the comparator 50 included in the anomaly detection circuit 110_1 is the potential (VSS+VC), and a high-level potential for the comparator 50 included in the anomaly detection circuit 1102 is the potential (VSS+2×VC).

Figure 4B:
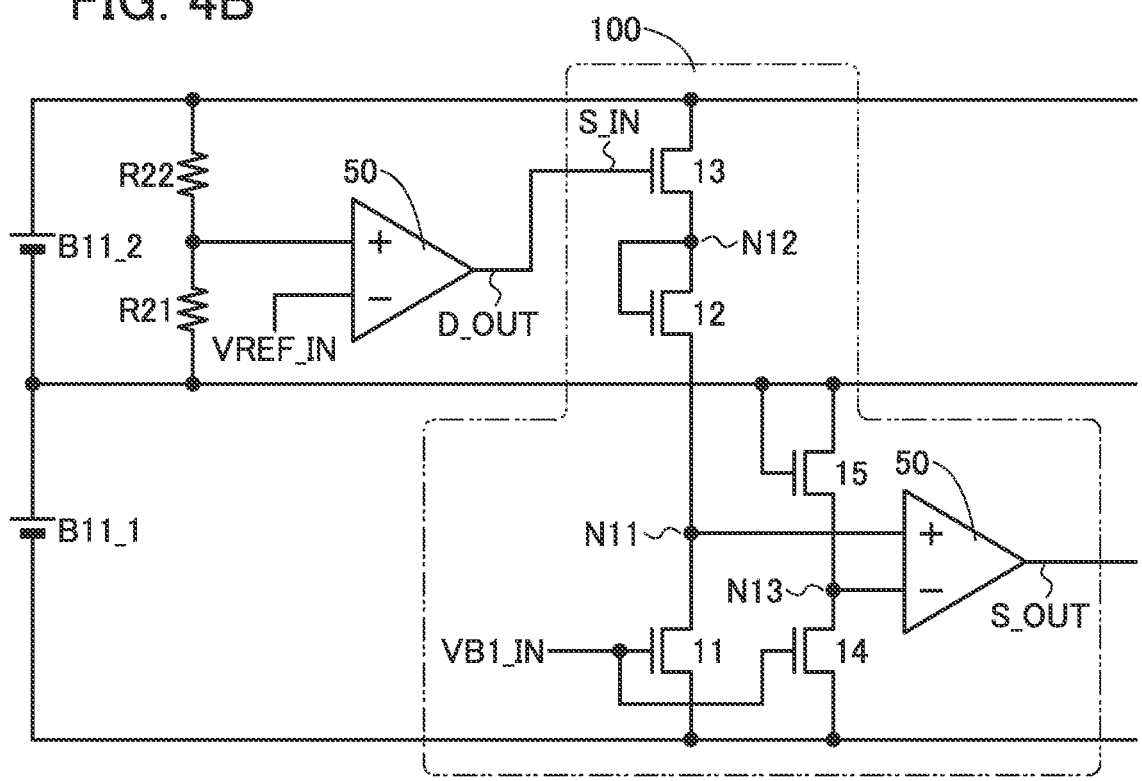
FIG. 4B is a diagram illustrating an example in which the anomaly detection circuit is connected to a semiconductor device.

Next, FIG. 4B illustrates an example in which the output terminal D_OUT of the anomaly detection circuit 110_2 is electrically connected to the input terminal S_IN of the semiconductor device 100. Note that the anomaly detection circuit 110_1 is not illustrated in FIG. 4B.

In FIG. 4B, the output terminal D_OUT of the anomaly detection circuit 110_2 is electrically connected to the input terminal S_IN of the semiconductor device 100. The negative electrode of the secondary battery B11_1 is electrically connected to the wiring VSS_IN of the semiconductor device 100; the positive electrode of the secondary battery B11_1 and the negative electrode of the secondary battery B11_2 are electrically connected to the wiring VD1_IN; and the positive electrode of the secondary battery B11_2 is electrically connected to the wiring VD2_IN.

In FIG. 4B, the low power supply potential VSS is supplied to the wiring VSS_IN of the semiconductor device 100; the potential (VSS+VC) is supplied to the wiring VD1_IN; and the potential (VSS+2×VC) is supplied to the wiring VD2_1N. At this time, when the high-level potential (VSS+2×VC) is input to the input terminal S_IN of the semiconductor device 100, the semiconductor device 100 outputs the potential (VSS+VC) from the output terminal S_OUT. Similarly, when the low-level potential (VSS+VC) is input to the input terminal S_IN of the semiconductor device 100, the semiconductor device 100 outputs the low power supply potential VSS from the output terminal S_OUT.

As described above, the semiconductor device 100 has a function of changing a high-level signal and a low-level signal output from the output terminal D_OUT of the anomaly detection circuit 110_2 respectively to the potential (VSS+VC) and the low power supply potential VSS. The potential (VSS+VC) and the low power supply potential VSS respectively correspond to a high-level signal and a low-level signal output from the output terminal D_OUT of the anomaly detection circuit 110_1, and signals output from the output terminals D_OUT of the anomaly detection circuit 110_2 and the anomaly detection circuit 1101 can be processed by a logic circuit supplied with the same power supply potential.

An OS transistor is used as each of the transistors included in the semiconductor device 100, whereby the semiconductor device 100 can have high reliability even in a high-temperature environment.

Note that this embodiment can be implemented in combination with the other embodiments described in this specification as appropriate.

Embodiment 2

In this embodiment, a structure example of an OS transistor that can be used in the semiconductor device 100 described in the above embodiment will be described. Note that an OS transistor is a thin film transistor and can be stacked to be provided; therefore, in this embodiment, a structure example of a semiconductor device in which an OS transistor is provided above a Si transistor formed on a single crystal silicon substrate will be described.

<Structure Example of Semiconductor Device>

Figure 5:
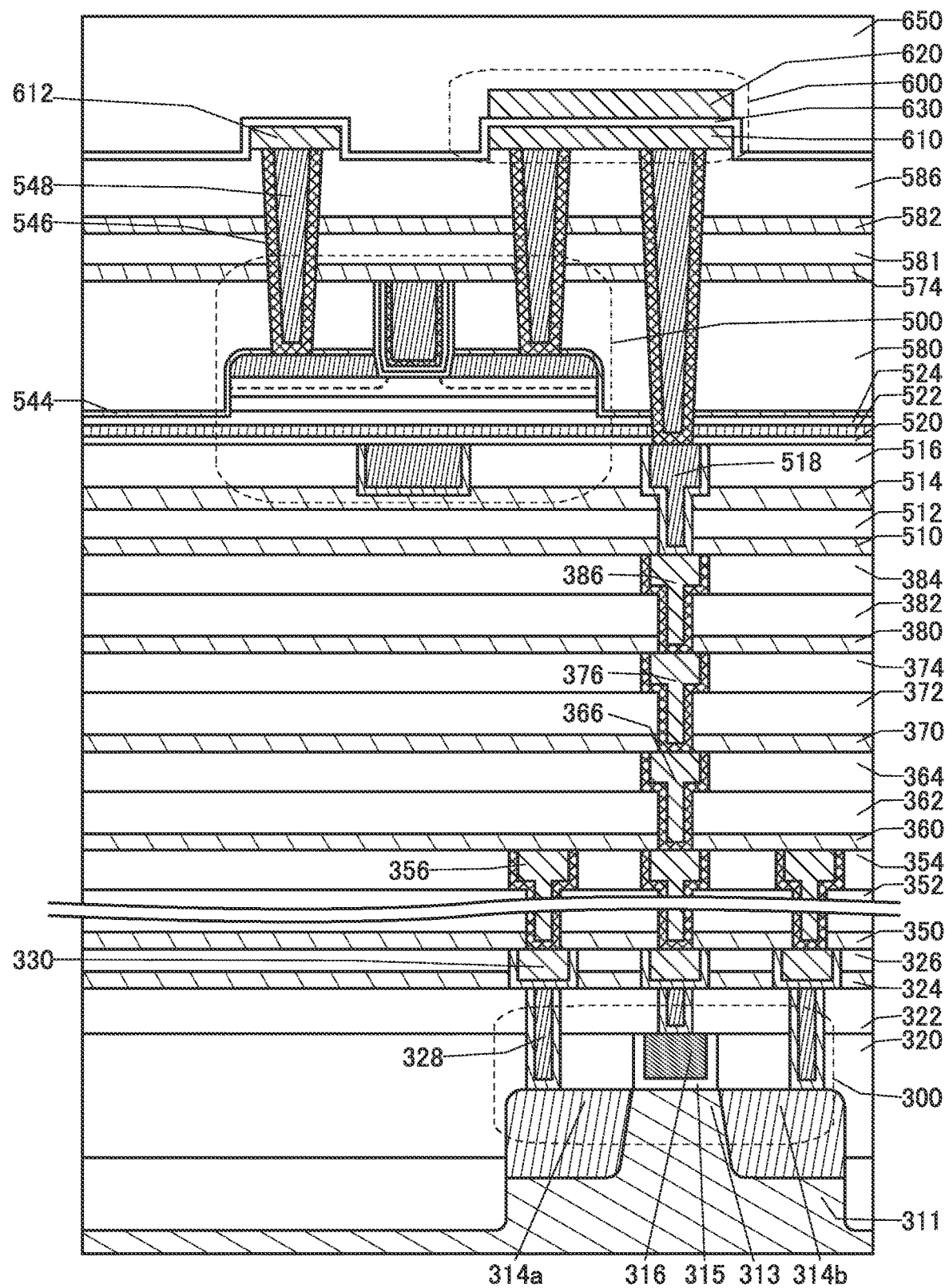
FIG. 5 is a cross-sectional view illustrating a structure example of a semiconductor device.
Figure 6A:
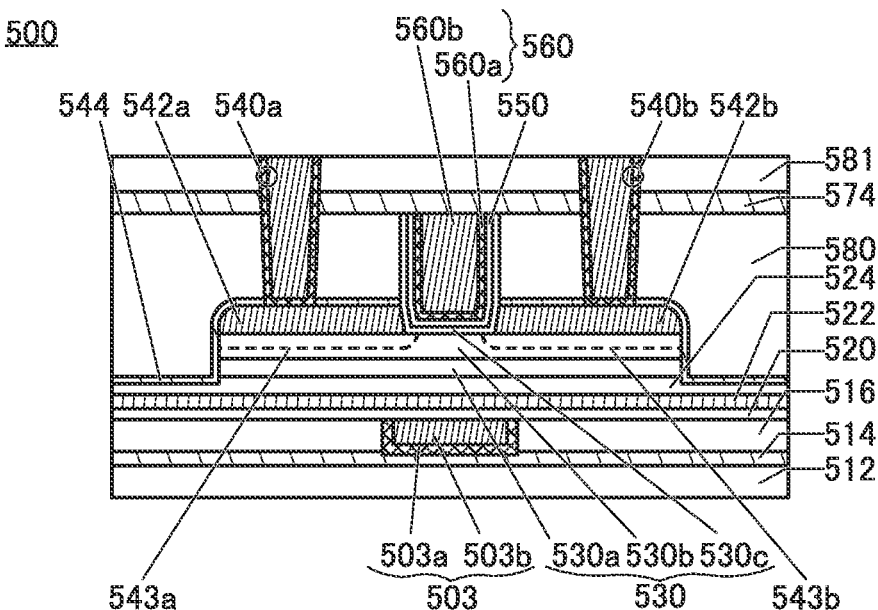
FIG. 6A, FIG. 6B, and FIG. 6C are cross-sectional views illustrating structure examples of transistors.
Figure 6B:
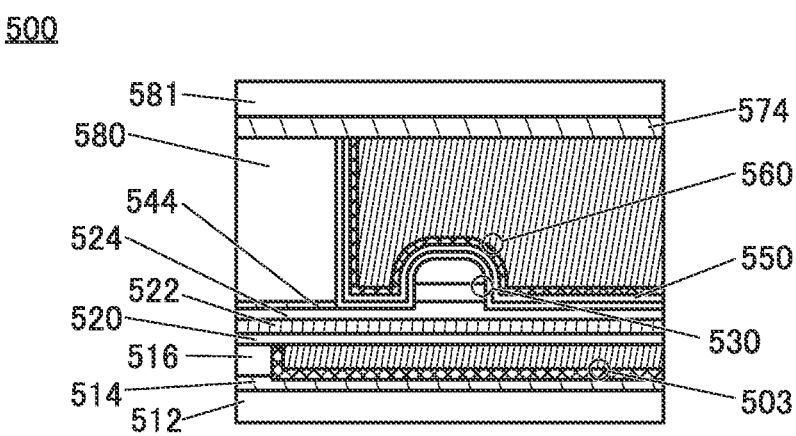
Figure 6C:
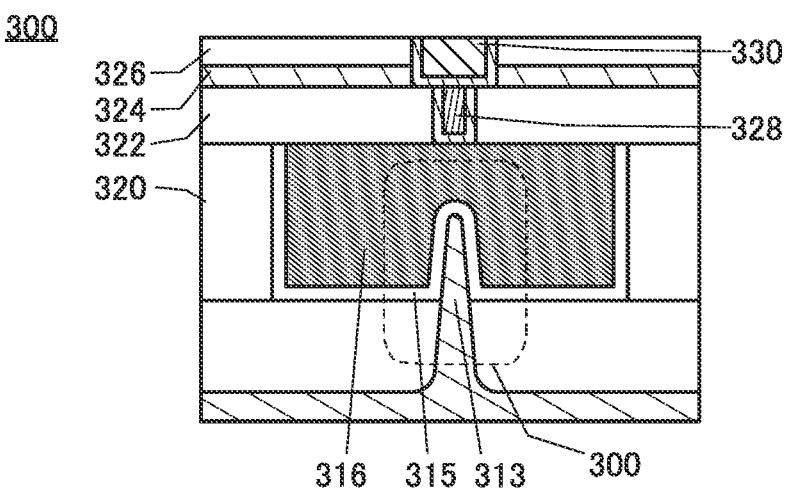

A semiconductor device illustrated in FIG. 5 includes a transistor 300, a transistor 500, and a capacitor 600. FIG. 6A is a cross-sectional view of the transistor 500 in the channel length direction, FIG. 6B is a cross-sectional view of the transistor 500 in the channel width direction, and FIG. 6C is a cross-sectional view of the transistor 300 in the channel width direction.

The transistor 500 is a transistor containing a metal oxide in its channel formation region (OS transistor). The transistor 500 has the following features: a high voltage can be applied between a source and a drain, off-state current is less likely to be increased even in a high-temperature environment, and the ratio of on-state current to off-state current is high even in a high-temperature environment; therefore, in the above embodiment, the use of this transistor in the semiconductor device 100 allows the semiconductor device 100 to have high reliability.

The semiconductor device described in this embodiment includes the transistor 300, the transistor 500, and the capacitor 600 as illustrated in FIG. 5. The transistor 500 is provided above the transistor 300, and the capacitor 600 is provided above the transistor 300 and the transistor 500.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region.

As illustrated in FIG. 6C, in the transistor 300, the top surface and a side surface in the channel width direction of the semiconductor region 313 are covered with the conductor 316 with the insulator 315 therebetween. The effective channel width is increased in the Fin-type transistor 300, whereby the on-state characteristics of the transistor 300 can be improved. In addition, since contribution of an electric field of the gate electrode can be increased, the off-state characteristics of the transistor 300 can be improved.

Note that the transistor 300 can be a p-channel transistor or an n-channel transistor.

It is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor, further preferably single crystal silicon. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that since the work function of a conductor depends on a material of the conductor, Vth of the transistor can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Note that the transistor 300 illustrated in FIG. 5 is just an example and the structure is not limited thereto; an appropriate transistor can be used in accordance with a circuit configuration or a driving method.

An insulator 320, an insulator 322, an insulator 324, and an insulator 326 are stacked in this order to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for planarizing a level difference caused by the transistor 300 or the like provided below the insulator 322. For example, the top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low relative permittivity is used for an interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 function as a plug or a wiring. A plurality of conductors functioning as plugs or wirings are collectively denoted by the same reference numeral in some cases. Furthermore, in this specification and the like, a wiring and a plug connected to the wiring may be a single component. That is, there are cases where part of a conductor functions as a wiring and another part of the conductor functions as a plug.

As a material for each of plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

A wiring layer may be provided over the insulator 326 and the conductor 330. For example, in FIG. 5, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening of the insulator 350 having a barrier property against hydrogen. With this structure, the transistor 300 and the transistor 500 can be separated by a barrier layer, so that the diffusion of hydrogen from the transistor 300 into the transistor 500 can be inhibited.

Note that as the conductor having a barrier property against hydrogen, tantalum nitride can be used, for example. The use of a stack including tantalum nitride and tungsten having high conductivity can inhibit the diffusion of hydrogen from the transistor 300 while the conductivity of a wiring is kept. In that case, the tantalum nitride layer having a barrier property against hydrogen is preferably in contact with the insulator 350 having a barrier property against hydrogen.

A wiring layer may be provided over the insulator 354 and the conductor 356. For example, in FIG. 5, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening of the insulator 360 having a barrier property against hydrogen. With this structure, the transistor 300 and the transistor 500 can be separated by a barrier layer, so that the diffusion of hydrogen from the transistor 300 into the transistor 500 can be inhibited.

A wiring layer may be provided over the insulator 364 and the conductor 366. For example, in FIG. 5, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening of the insulator 370 having a barrier property against hydrogen. With this structure, the transistor 300 and the transistor 500 can be separated by a barrier layer, so that the diffusion of hydrogen from the transistor 300 into the transistor 500 can be inhibited.

A wiring layer may be provided over the insulator 374 and the conductor 376. For example, in FIG. 5, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening of the insulator 380 having a barrier property against hydrogen. With this structure, the transistor 300 and the transistor 500 can be separated by a barrier layer, so that the diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen or hydrogen is preferably used for any of the insulator 510, the insulator 512, the insulator 514, and the insulator 516.

For example, the insulator 510 and the insulator 514 are preferably formed using a film having a barrier property that prevents diffusion of hydrogen or impurities from the substrate 311, the region where the transistor 300 is provided, or the like into the region where the transistor 500 is provided. Therefore, a material similar to that for the insulator 324 can be used.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

For the film having a barrier property against hydrogen used as the insulator 510 and the insulator 514, for example, a metal oxide such as aluminum oxide, hafnium oxide, or tantalum oxide is preferably used.

In particular, aluminum oxide has a high blocking effect that inhibits the passage of both oxygen and impurities such as hydrogen and moisture which are factors of a change in electrical characteristics of the transistor. Accordingly, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 320, for example. When a material with a relatively low permittivity is used for an interlayer film, the parasitic capacitance between wirings can be reduced. Silicon oxide films, silicon oxynitride films, or the like can be used as the insulator 512 and the insulator 516, for example.

A conductor 518, a conductor included in the transistor 500 (a conductor 503), and the like are embedded in the insulator 510, the insulator 512, the insulator 514, and the insulator 516. Note that the conductor 518 functions as a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; thus, the diffusion of hydrogen from the transistor 300 into the transistor 500 can be inhibited.

The transistor 500 is provided above the insulator 516.

As illustrated in FIGS. 6A and 6B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; a conductor 560 positioned in the opening; an insulator 550 positioned between the conductor 560 and the oxide 530b, the conductor 542a, the conductor 542b, and the insulator 580; and an oxide 530c positioned between the insulator 550 and the oxide 530b, the conductor 542a, the conductor 542b, and the insulator 580.

As illustrated in FIG. 6A and FIG. 6B, an insulator 544 is preferably positioned between the insulator 580 and the oxide 530a, the oxide 530b, the conductor 542a, and the conductor 542b. In addition, as illustrated in FIG. 6A and FIG. 6B, the conductor 560 preferably includes a conductor 560a provided inside the insulator 550 and a conductor 560b embedded inside the conductor 560a. Moreover, as illustrated in FIG. 6A and FIG. 6B, an insulator 574 is preferably positioned over the insulator 580, the conductor 560, and the insulator 550.

Hereinafter, the oxide 530a, the oxide 530b, and the oxide 530c may be collectively referred to as an oxide 530. The conductor 542a and the conductor 542b may be collectively referred to as a conductor 542.

The transistor 500 has a structure in which three layers of the oxide 530a, the oxide 530b, and the oxide 530c are stacked in the region where the channel is formed and its vicinity; however, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be provided. Although the conductor 560 is shown to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 5 and FIG. 6A and FIG. 6B is an example, and the structure is not limited thereto; an appropriate transistor can be used in accordance with a circuit configuration or a driving method.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening of the insulator 580. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping the conductor 542a or the conductor 542b. Thus, parasitic capacitance formed between the conductor 560 and each of the conductor 542a and the conductor 542b can be reduced. As a result, the transistor 500 can have improved switching speed and excellent frequency characteristics.

The conductor 560 sometimes functions as a first gate (also referred to as top gate) electrode. The conductor 503 sometimes functions as a second gate (also referred to as bottom gate) electrode. In that case, Vth of the transistor 500 can be controlled by changing a potential applied to the conductor 503 independently of a potential applied to the conductor 560. In particular, Vth of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to be overlapped by the oxide 530 and the conductor 560. Thus, when potentials are applied to the conductor 560 and the conductor 503, an electric field generated from the conductor 560 and an electric field generated from the conductor 503 are connected, so that the channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

Furthermore, in this specification and the like, the S-channel structure has a feature in that the side surface and the vicinity of the oxide 530 in contact with the conductor 542a and the conductor 542b functioning as a source electrode and a drain electrode are of I-type like the channel formation region. The side surface and the vicinity of the oxide 530 in contact with the conductor 542a and the conductor 542b are in contact with the insulator 544 and thus can be of I-type like the channel formation region. Note that in this specification and the like, "I-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

The conductor 503 has a structure similar to that of the conductor 518; a conductor 503a is formed in contact with an inner wall of an opening in the insulator 514 and the insulator 516, and a conductor 503b is formed on the inner side.

The insulator 520, the insulator 522, the insulator 524, and the insulator 550 have a function of a gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

In the case where the insulator 524 includes an excess-oxygen region, it is preferred that the insulator 522 have a function of inhibiting diffusion of oxygen (e.g., an oxygen atom, an oxygen molecule, or the like) (the oxygen is less likely to pass).

When the insulator 522 has a function of inhibiting diffusion of oxygen or impurities, oxygen contained in the oxide 530 is not diffused to the insulator 520 side, which is preferable. Furthermore, the conductor 503 can be prevented from reacting with oxygen contained in the insulator 524 or the oxide 530.

For example, the insulator 522 is preferably formed using a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba, Sr)TiO$_3$ (BST). With miniaturization and high integration of transistors, a problem such as leakage current may arise because of a thinner gate insulating film. When a high-k material is used for an insulator functioning as the gate insulating film, a gate potential during operation of the transistor can be reduced while the physical thickness is maintained.

It is particularly preferable to use an insulator containing an oxide of one or both of aluminum and hafnium, which is an insulating material having a function of inhibiting diffusion of impurities, oxygen, and the like (the oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride, which have thermal stability, are preferable. Furthermore, when an insulator which is a high-k material is combined with silicon oxide or silicon oxynitride, the insulator 520 having a stacked-layer structure that has thermal stability and a high relative permittivity can be obtained.

Note that the insulator 520, the insulator 522, and the insulator 524 may each have a stacked-layer structure of two or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 530, an In—Ga oxide or an In—Zn oxide may be used.

Furthermore, a metal oxide with a low carrier density is preferably used for the transistor 500. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using a metal oxide containing a large amount of hydrogen is likely to have normally-on characteristics.

A defect in which hydrogen has entered an oxygen vacancy can function as a donor of the metal oxide. However, it is difficult to evaluate the defects quantitatively. Thus, the metal oxide is sometimes evaluated by not its donor concentration but its carrier concentration. Therefore, in this specification and the like, the carrier density assuming the state where an electric field is not applied is sometimes used, instead of the donor concentration, as the parameter of the metal oxide. That is, "carrier density" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide with a sufficiently low concentration of impurities such as hydrogen is used for a channel formation region of a transistor, the transistor can have stable electrical characteristics.

When a metal oxide is used for the oxide 530, the carrier density of the metal oxide in the channel formation region is preferably lower than or equal to $1 \times 10^{18}$ cm$^{-3}$, further preferably lower than $1 \times 10^{17}$ cm$^{-3}$, further preferably lower than $1 \times 10^{16}$ cm$^{-3}$, further preferably lower than $1 \times 10^{13}$ cm$^{-3}$, further preferably lower than $1 \times 10^{12}$ cm$^{-3}$. Note that the lower limit of the carrier density of the metal oxide in the channel formation region is not particularly limited and can be, for example, $1 \times 10^{-9}$ cm$^{-3}$.

When a metal oxide is used for the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductor 542a and the conductor 542b), a layer is sometimes formed between the conductor 542a and the oxide 530b and between the conductor 542b and the oxide 530b. The layer contains more oxygen than the conductor 542 does, and thus presumably has an insulating property. In this case, a three-layer structure of the conductor 542, the layer, and the oxide 530b can be regarded as a three-layer structure of a metal, an insulator, and a semiconductor and is sometimes referred to as a MIS (Metal-Insulator-Semiconductor) structure or a diode junction structure having an MIS structure as its main part.

The above layer is not necessarily formed between the conductor 542 and the oxide 530b; for example, the layer is sometimes formed between the conductor 542 and the oxide 530c, or the layer is sometimes formed between the conductor 542 and the oxide 530b and between the conductor 542 and the oxide 530c.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of oxides that differ in the atomic ratio of metal atoms. Specifically, the atomic proportion of the element M in constituent elements in the metal oxide used for the oxide 530a is preferably greater than the atomic proportion of the element M in constituent elements in the metal oxide used for the oxide 530b. Moreover, the atomic ratio of the element M to In in the metal oxide used for the oxide 530a is preferably greater than the atomic ratio of the element M to In in the metal oxide used for the oxide 530b. Furthermore, the atomic ratio of In to the element M in the metal oxide used for the oxide 530b is preferably greater than the atomic ratio of In to the element M in the metal oxide used for the oxide 530a. A metal oxide that can be used for the oxide 530a or the oxide 530b can be used for the oxide 530c.

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at an interface between the oxide 530a and the oxide 530b and an interface between the oxide 530b and the oxide 530c is preferably made low.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used for the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have high on-state current.

The conductor 542 (the conductor 542a and the conductor 542b) functioning as the source electrode and the drain electrode is provided over the oxide 530b. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As illustrated in FIG. 6A, a region 543 (a region 543a and a region 543b) is sometimes formed as a low-resistance region at and near the interface between the oxide 530 and the conductor 542. In that case, the region 543a functions as one of a source region and a drain region, and the region 543b functions as the other of the source region and the drain region. The channel formation region is formed in a region between the region 543a and the region 543b.

When the conductor 542 is provided in contact with the oxide 530, the oxygen concentration in the region 543 sometimes decreases. In addition, a metal compound layer that contains the metal contained in the conductor 542 and the component of the oxide 530 is sometimes formed in the region 543. In such a case, the carrier density of the region 543 increases, and the region 543 becomes a low-resistance region.

The insulator 544 is provided to cover the conductor 542 and inhibits oxidation of the conductor 542. At this time, the insulator 544 may be provided to cover a side surface of the oxide 530 and to be in contact with the insulator 524.

A metal oxide containing one or more kinds selected from hafnium, aluminum, gallium, yttrium, zirconium, tungsten, titanium, tantalum, nickel, germanium, magnesium, and the like can be used as the insulator 544.

For the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542 is an oxidation-resistant material or does not significantly lose its conductivity even after absorbing oxygen. Design is appropriately set in consideration of required transistor characteristics.

The insulator 550 functions as a gate insulating film. The insulator 550 is preferably positioned in contact with the inner side (the top surface and the side surface) of the oxide 530c. The insulator 550 is preferably formed using an insulator from which oxygen is released by heating. An oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{21}$ atoms/cm$^3$ in TDS analysis is used, for example. Note that the temperature of the film surface in the TDS analysis is preferably higher than or equal to 100° C. and lower than or equal to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

When an insulator from which oxygen is released by heating is provided as the insulator 550 in contact with the top surface of the oxide 530c, oxygen can be efficiently supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidization of the conductor 560 due to excess oxygen can be inhibited. For the metal oxide, a material that can be used for the insulator 544 is used.

Although the conductor 560 functioning as the first gate electrode has a two-layer structure in FIG. 6A and FIG. 6B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting oxygen diffusion, it is possible to prevent a reduction in conductivity of the conductor 560b due to oxidation caused by oxygen contained in the insulator 550. As a conductive material having a function of inhibiting oxygen diffusion, for example, tantalum, tantalum nitride, ruthenium, ruthenium oxide, or the like is preferably used.

The conductor 560b is preferably formed using a conductive material containing tungsten, copper, or aluminum as its main component. The conductor 560b also functions as a wiring and thus is preferably formed using a conductor having high conductivity. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542 with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide, in which an excess-oxygen region can be easily formed in a later step, are preferable.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. Note that the concentration of impurities such as water or hydrogen in the insulator 580 is preferably lowered.

The opening of the insulator 580 is formed to overlap with a region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; hence, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 or the like, the concentration of impurities such as water or hydrogen in the insulator 581 is preferably lowered.

A conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has a high blocking effect that inhibits the passage of both oxygen and impurities such as hydrogen and moisture which are factors of a change in electrical characteristics of the transistor. Accordingly, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. When a material with a relatively low permittivity is used for an interlayer film, the parasitic capacitance between wirings can be reduced. For example, a silicon oxide film, a silicon oxynitride film, or the like can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using a material similar to those for the conductor 328 and the conductor 330.

In addition, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each of which has a single-layer structure are illustrated in FIG. 5, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. The conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be inhibited and reliability can be improved in a semiconductor device using a transistor including an oxide semiconductor. Alternatively, a transistor including an oxide semiconductor and having high on-state current can be provided. Alternatively, a transistor including an oxide semiconductor and having low off-state current can be provided. Alternatively, a semiconductor device with low power consumption can be provided. Alternatively, a semiconductor device using a transistor including an oxide semiconductor can be miniaturized or highly integrated.

<Transistor Structure Examples>

Note that the structure of the transistor 500 in the semiconductor device described in this embodiment is not limited to the above. Examples of structures that can be used for the transistor 500 will be described below.

<Transistor Structure Example 1>

Figure 7A:
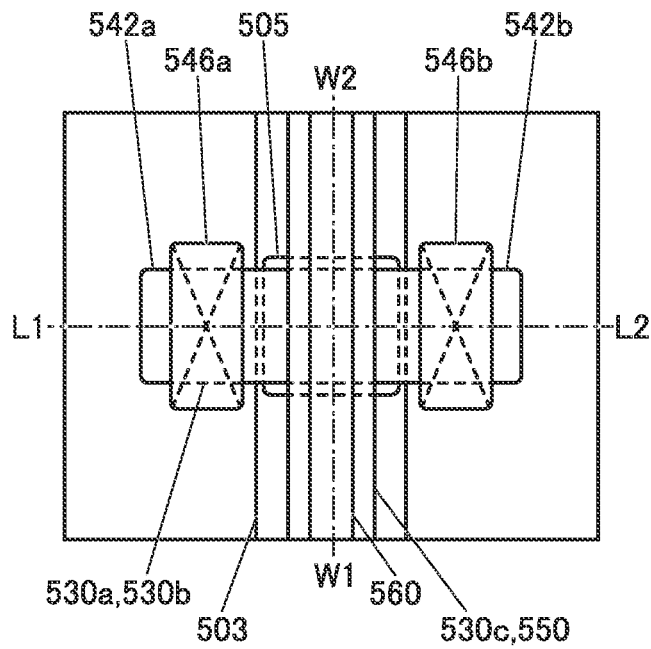
FIG. 7A is a top view illustrating a structure example of a transistor.
Figure 7C:
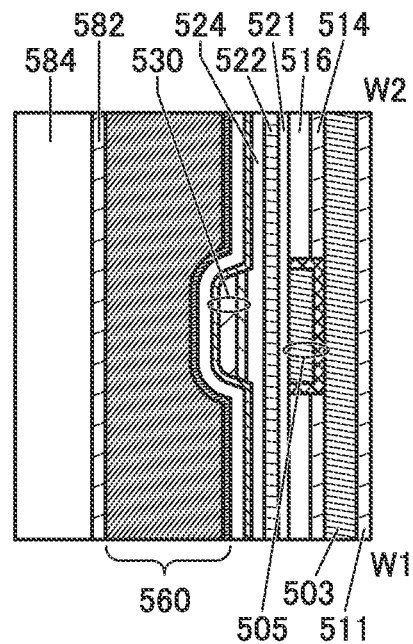
FIG. 7B and FIG. 7C are cross-sectional views illustrating the structure example of the transistor.
Figure 7B:
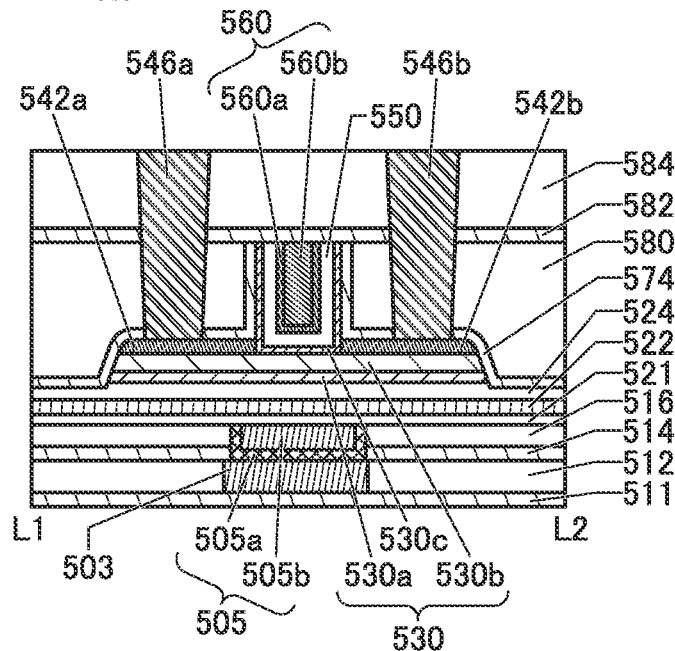

A structure example of a transistor 510A is described with reference to FIG. 7A, FIG. 7B, and FIG. 7C. FIG. 7A is a top view of the transistor 510A. FIG. 7B is a cross-sectional view of a portion indicated by a dashed-dotted line L1-L2 in FIG. 7A. FIG. 7C is a cross-sectional view of a portion indicated by a dashed-dotted line W1-W2 in FIG. 7A. Note that for clarification of the drawing, some components are not illustrated in the top view of FIG. 7A.

FIG. 7A, FIG. 7B, and FIG. 7C illustrate the transistor 510A and the insulator 511, the insulator 512, the insulator 514, the insulator 516, the insulator 580, the insulator 582, and an insulator 584 that function as interlayer films. In addition, conductor 546 (a conductor 546a and a conductor 546b) that is electrically connected to the transistor 510A and functions as a contact plug, and the conductor 503 functioning as a wiring are illustrated.

The transistor 510A includes the conductor 560 (the conductor 560a and the conductor 560b) functioning as a first gate electrode; a conductor 505 (a conductor 505a and a conductor 505b) functioning as a second gate electrode; the insulator 550 functioning as a first gate insulating film; an insulator 521, the insulator 522, and the insulator 524 that function as a second gate insulating film; the oxide 530 (the oxide 530a, the oxide 530b, and the oxide 530c) including a region where a channel is formed; the conductor 542a functioning as one of a source and a drain; the conductor 542b functioning as the other of the source and the drain; and the insulator 574.

In the transistor 510A illustrated in FIG. 7, the oxide 530c, the insulator 550, and the conductor 560 are positioned in an opening provided in the insulator 580 with the insulator 574 positioned therebetween. Moreover, the oxide 530c, the insulator 550, and the conductor 560 are positioned between the conductor 542a and the conductor 542b.

The insulator 511 and the insulator 512 function as interlayer films.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 511 preferably functions as a barrier film that inhibits entry of impurities such as water or hydrogen into the transistor 510A from the substrate side. Accordingly, for the insulator 511, it is preferable to use an insulating material that has a function of inhibiting diffusion of impurities such as a hydrogen atom, a hydrogen molecule, a water molecule, and a copper atom (through which the above impurities do not easily pass). Alternatively, it is preferable to use an insulating material that has a function of inhibiting diffusion of oxygen (e.g., at least one of oxygen atoms, oxygen molecules, and the like) (through which the above oxygen does not easily pass). Moreover, aluminum oxide or silicon nitride, for example, may be used for the insulator 511. This structure can inhibit diffusion of impurities such as hydrogen and water to the transistor 510A side from the substrate side of the insulator 511.

For example, the permittivity of the insulator 512 is preferably lower than that of the insulator 511. When a material with a low permittivity is used for the interlayer film, the parasitic capacitance generated between wirings can be reduced.

The conductor 503 is formed to be embedded in the insulator 512. Here, the level of the top surface of the conductor 503 and the level of the top surface of the insulator 512 can be substantially the same. Note that although a structure in which the conductor 503 is a single layer is illustrated, the present invention is not limited thereto. For example, the conductor 503 may have a multi-layer structure of two or more layers. Note that for the conductor 503, a conductive material that has high conductivity and contains tungsten, copper, or aluminum as its main component is preferably used.

In the transistor 510A, the conductor 560 sometimes functions as a first gate (also referred to as top gate) electrode. The conductor 505 sometimes functions as a second gate (also referred to as bottom gate) electrode. In that case, the threshold voltage of the transistor 510A can be controlled by changing a potential applied to the conductor 505 independently of a potential applied to the conductor 560. In particular, the threshold voltage of the transistor 510A can be higher than 0 V and the off-state current can be reduced by applying a negative potential to the conductor 505. Thus, drain current at the time when a potential applied to the conductor 560 is 0 V can be lower in the case where a negative potential is applied to the conductor 505 than in the case where a negative potential is not applied to the conductor 505.

For example, when the conductor 505 and the conductor 560 overlap with each other, in the case where a potential is applied to the conductor 560 and the conductor 505, an electric field generated from the conductor 560 and an electric field generated from the conductor 505 are connected and can cover a channel formation region formed in the oxide 530.

That is, the channel formation region can be electrically surrounded by the electric field of the conductor 560 having a function of the first gate electrode and the electric field of the conductor 505 having a function of the second gate electrode. In other words, the transistor 510A has a surrounded channel (S-channel) structure, like the transistor 500 described above.

Like the insulator 511 or the insulator 512, the insulator 514 and the insulator 516 function as interlayer films. For example, the insulator 514 preferably functions as a barrier film that inhibits entry of impurities such as water or hydrogen into the transistor 510A from the substrate side. This structure can inhibit diffusion of impurities such as hydrogen and water to the transistor 510A side from the substrate side of the insulator 514. Moreover, for example, the insulator 516 preferably has a lower permittivity than the insulator 514. When a material with a low permittivity is used for the interlayer film, the parasitic capacitance generated between wirings can be reduced.

In the conductor 505 functioning as the second gate, the conductor 505a is formed in contact with an inner wall of an opening in the insulator 514 and the insulator 516, and the conductor 505b is formed further inside. Here, the top surfaces of the conductor 505a and the conductor 505b and the top surface of the insulator 516 can be substantially level with each other. Although the transistor 510A having a structure in which the conductor 505a and the conductor 505b are stacked is illustrated, the present invention is not limited thereto. For example, the conductor 505 may have a single-layer structure or a stacked-layer structure of three or more layers.

Here, for the conductor 505a, a conductive material that has a function of inhibiting diffusion of impurities such as a hydrogen atom, a hydrogen molecule, a water molecule, and a copper atom (through which the above impurities are less likely to pass) is preferably used. Alternatively, it is preferable to use a conductive material that has a function of inhibiting diffusion of oxygen (e.g., at least one of oxygen atoms, oxygen molecules, and the like) (the above oxygen is less likely to pass). Note that in this specification, a function of inhibiting diffusion of impurities or oxygen means a function of inhibiting diffusion of any one or all of the above impurities and the above oxygen.

For example, when the conductor 505a has a function of inhibiting diffusion of oxygen, a reduction in conductivity of the conductor 505b due to oxidation can be inhibited.

In the case where the conductor 505 doubles as a wiring, the conductor 505b is preferably formed using a conductive material that has high conductivity and contains tungsten, copper, or aluminum as its main component. In that case, the conductor 503 is not necessarily provided. Note that the conductor 505b is illustrated as a single layer but may have a stacked-layer structure, for example, a stack of any of the above conductive materials and titanium or titanium nitride.

The insulator 521, the insulator 522, and the insulator 524 function as a second gate insulating film.

The insulator 522 preferably has a barrier property. The insulator 522 having a barrier property functions as a layer that inhibits entry of impurities such as hydrogen into the transistor 510A from the surroundings of the transistor 510A.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current may arise because of a thinner gate insulating film. When a high-k material is used for an insulator functioning as the gate insulating film, a gate potential during operation of the transistor can be reduced while the physical thickness is maintained.

It is preferable that the insulator 521 be thermally stable. For example, silicon oxide and silicon oxynitride, which have thermal stability, are preferable. Furthermore, when an insulator which is a high-k material is combined with silicon oxide or silicon oxynitride, the insulator 521 having a stacked-layer structure that has thermal stability and a high relative permittivity can be obtained.

Note that the second gate insulating film is shown to have a three-layer stacked structure in FIG. 7, but may have a single- or two-layer structure or a stacked-layer structure of four or more layers. In that case, without limitation to a stacked-layer structure formed of the same material, a stacked-layer structure formed of different materials may be employed.

The oxide 530 including a region functioning as the channel formation region includes the oxide 530a, the oxide 530b over the oxide 530a, and the oxide 530c over the oxide 530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the above-described oxide semiconductor, which is one kind of metal oxide, can be used.

Note that the oxide 530c is preferably provided in the opening in the insulator 580 with the insulator 574 positioned therebetween. When the insulator 574 has a barrier property, diffusion of impurities from the insulator 580 into the oxide 530 can be inhibited.

One of the conductors 542 functions as a source electrode and the other functions as a drain electrode.

For the conductor 542a and the conductor 542b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and its oxidation resistance is high.

Although a single-layer structure is illustrated in FIG. 7, a stacked-layer structure of two or more layers may be employed. For example, a tantalum nitride film and a tungsten film may be stacked. Alternatively, a titanium film and an aluminum film may be stacked. Further alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

A three-layer structure consisting of a titanium film or a titanium nitride film, an aluminum film or a copper film stacked over the titanium film or the titanium nitride film, and a titanium film or a titanium nitride film formed thereover; a three-layer structure consisting of a molybdenum film or a molybdenum nitride film, an aluminum film or a copper film stacked over the molybdenum film or the molybdenum nitride film, and a molybdenum film or a molybdenum nitride film formed thereover; or the like may be employed. Note that a transparent conductive material containing indium oxide, tin oxide, or zinc oxide may be used.

A barrier layer may be provided over the conductor 542. The barrier layer is preferably formed using a material having a barrier property against oxygen or hydrogen. This structure can inhibit oxidation of the conductor 542 at the time of deposition of the insulator 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductor 542 can be expanded. For example, a material having a low oxidation resistance and high conductivity, such as tungsten or aluminum, can be used for the conductor 542. Moreover, for example, a conductor that can be easily deposited or processed can be used.

The insulator 550 functions as a first gate insulating film. The insulator 550 is preferably provided in the opening in the insulator 580 with the oxide 530c and the insulator 574 positioned therebetween.

As miniaturization and high integration of transistors progress, a problem such as leakage current may arise because of thinner gate insulating film. In that case, the insulator 550 may have a stacked-layer structure like the second gate insulating film. When the insulator functioning as the gate insulating film has a stacked-layer structure of a high-k material and a thermally stable material, a gate potential during operation of the transistor can be reduced while the physical thickness is maintained. Furthermore, the stacked-layer structure can be thermally stable and have a high relative permittivity.

The conductor 560 functioning as a first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

As a conductive material having a function of inhibiting diffusion of oxygen, for example, tantalum, tantalum nitride, ruthenium, or ruthenium oxide is preferably used. For the conductor 560a, the oxide semiconductor that can be used as the oxide 530 can be used. In that case, when the conductor 560b is deposited by a sputtering method, the conductor 560a can have a reduced electric resistance to be a conductor. This can be referred to as an OC (Oxide Conductor) electrode.

The conductor 560b is preferably formed using a conductive material containing tungsten, copper, or aluminum as its main component. The conductor 560 functions as a wiring and thus is preferably formed using a conductor having high conductivity. For example, a conductive material containing tungsten, copper, or aluminum as its main component can be used. The conductor 560b may have a stacked-layer structure, for example, a stack of any of the above conductive materials and titanium or titanium nitride.

The insulator 574 is positioned between the insulator 580 and the transistor 510A. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit diffusion of impurities such as water and hydrogen contained in the insulator 580 into the oxide 530b through the oxide 530c and the insulator 550. Furthermore, oxidation of the conductor 560 due to excess oxygen contained in the insulator 580 can be inhibited.

The insulator 580, the insulator 582, and the insulator 584 function as interlayer films.

Like the insulator 514, the insulator 582 preferably functions as a barrier insulating film that inhibits entry of impurities such as water or hydrogen into the transistor 510A from the outside.

Like the insulator 516, the insulator 580 and the insulator 584 preferably have a lower permittivity than the insulator 582. When a material with a low permittivity is used for the interlayer films, the parasitic capacitance generated between wirings can be reduced.

The transistor 510A may be electrically connected to another component through a plug or a wiring such as the conductor 546 embedded in the insulator 580, the insulator 582, and the insulator 584.

As a material for the conductor 546, a conductive material such as a metal material, an alloy material, a metal nitride material, or a metal oxide material can be used as a single layer or stacked layers, as in the conductor 505. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductor 546 has a stacked-layer structure of tantalum nitride or the like, which is a conductor having a barrier property against hydrogen and oxygen, and tungsten, which has high conductivity, diffusion of impurities from the outside can be inhibited while the conductivity of a wiring is maintained.

With the above structure, a semiconductor device including a transistor that contains an oxide semiconductor and uses high on-state current can be provided. Alternatively, a semiconductor device using a transistor that contains an oxide semiconductor and has low off-state current can be provided. Alternatively, a semiconductor device that has small variations in electrical characteristics, stable electrical characteristics, and high reliability can be provided.

<Transistor Structure Example 2>

A structure example of a transistor 510B is described with reference to FIG. 8A, FIG. 8B, and FIG. 8C. FIG. 8A is a top view of the transistor 510B. FIG. 8B is a cross-sectional view of a portion indicated by a dashed-dotted line L1-L2 in FIG. 8A. FIG. 8C is a cross-sectional view of a portion indicated by a dashed-dotted line W1-W2 in FIG. 8A. Note that for clarification of the drawing, some components are not illustrated in the top view of FIG. 8A.

The transistor 510B is a variation example of the transistor 510A. Therefore, differences from the transistor 510A will be mainly described to avoid repeated description.

The transistor 510B includes a region where the conductor 542 (the conductor 542a and the conductor 542b), the oxide 530c, the insulator 550, and the conductor 560 overlap with each other. With this structure, a transistor having high on-state current can be provided. Moreover, a transistor having high controllability can be provided.

The conductor 560 functioning as a first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

The insulator 574 is preferably provided to cover the top surface and a side surface of the conductor 560, a side surface of the insulator 550, and the side surface of the oxide 530c. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit oxidation of the conductor 560. Moreover, the insulator 574 can inhibit diffusion of impurities such as water and hydrogen contained in the insulator 580 into the transistor 510B.

An insulator 576 (an insulator 576a and an insulator 576b) having a barrier property may be provided between the conductor 546 and the insulator 580. Providing the insulator 576 can prevent oxygen in the insulator 580 from reacting with the conductor 546 and oxidizing the conductor 546.

Furthermore, with the insulator 576 having a barrier property, the range of choices for the material of the conductor used as the plug or the wiring can be expanded. The use of a metal material having an oxygen absorbing property and high conductivity for the conductor 546, for example, can provide a semiconductor device with low power consumption. Specifically, a material having a low oxidation resistance and high conductivity, such as tungsten or aluminum, can be used. Moreover, for example, a conductor that can be easily deposited or processed can be used.

<Transistor Structure Example 3>

Figure 9A:
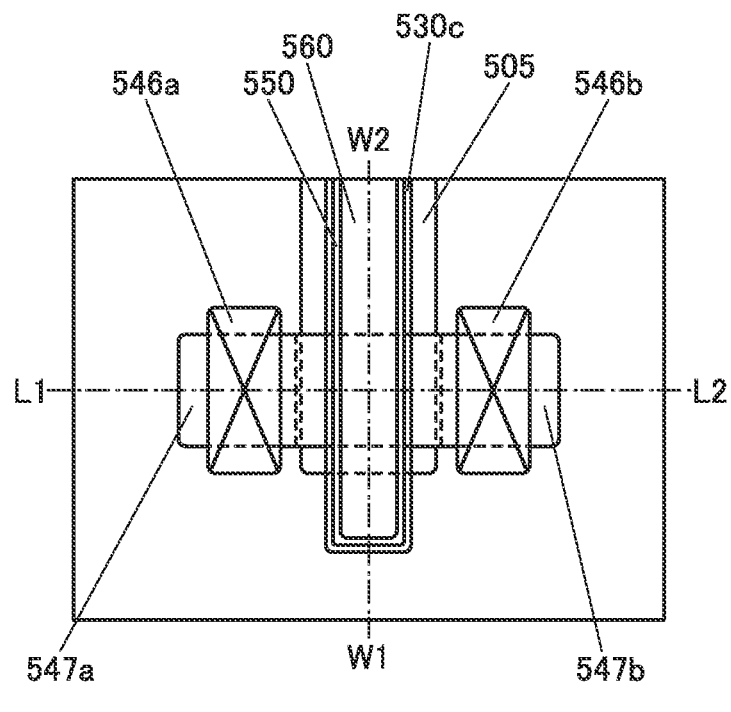
FIG. 9A is a top view illustrating a structure example of a transistor.
Figure 9C:
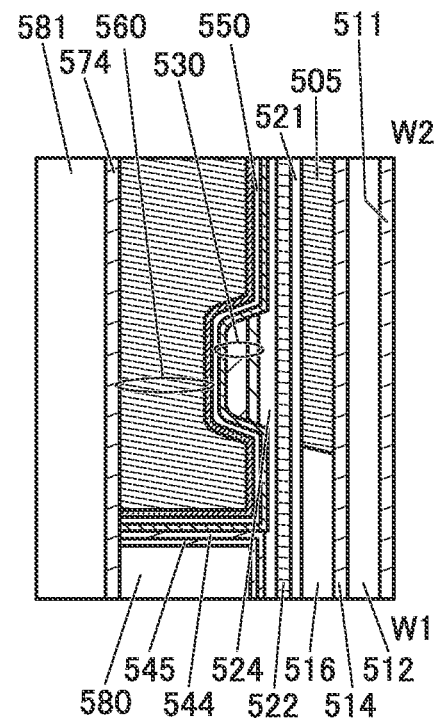
FIG. 9B and FIG. 9C are cross-sectional views illustrating the structure example of the transistor.
Figure 9B:
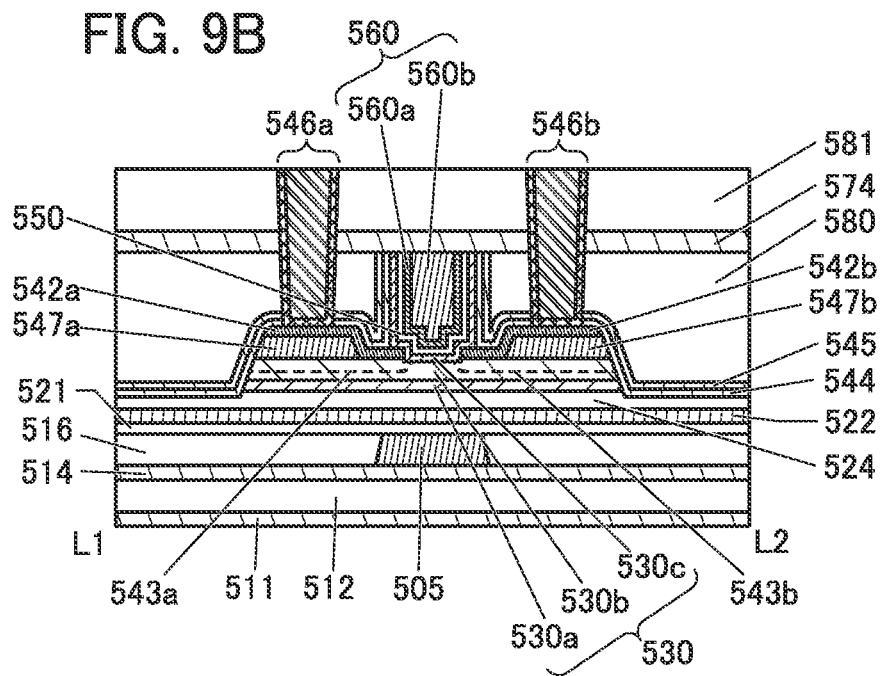

A structure example of a transistor 510C is described with reference to FIG. 9A, FIG. 9B, and FIG. 9C. FIG. 9A is a top view of the transistor 510C. FIG. 9B is a cross-sectional view of a portion indicated by a dashed-dotted line L1-L2 in FIG. 9A. FIG. 9C is a cross-sectional view of a portion indicated by a dashed-dotted line W1-W2 in FIG. 9A. Note that for clarification of the drawing, some components are not illustrated in the top view of FIG. 9A.

The transistor 510C is a variation example of the transistor 510A. Therefore, differences from the transistor 510A will be mainly described to avoid repeated description.

In the transistor 510C illustrated in FIG. 9, a conductor 547a is positioned between the conductor 542a and the oxide 530b and a conductor 547b is positioned between the conductor 542b and the oxide 530b. Here, the conductor 542a (the conductor 542b) has a region that extends beyond the top surface and a side surface on the conductor 560 side of the conductor 547a (the conductor 547b) and is in contact with the top surface of the oxide 530b. For the conductor 547, a conductor that can be used for the conductor 542 is used. It is preferred that the thickness of the conductor 547 be at least greater than that of the conductor 542.

In the transistor 510C illustrated in FIG. 9, because of the above structure, the conductor 542 can be closer to the conductor 560 than in the transistor 510A. Alternatively, the conductor 560 and an end portion of the conductor 542a and an end portion of the conductor 542b can overlap with each other. Accordingly, the effective channel length of the transistor 510C can be shortened, and the on-state current and the frequency characteristics can be improved.

The conductor 547a (the conductor 547b) is preferably provided to be overlapped by the conductor 542a (the conductor 542b). With such a structure, the conductor 547a (the conductor 547b) can function as a stopper to prevent over-etching of the oxide 530b in etching for forming the opening in which the conductor 546a (the conductor 546b) is to be embedded.

The transistor 510C illustrated in FIG. 9 may have a structure in which an insulator 545 is positioned on and in contact with the insulator 544. The insulator 544 preferably functions as a barrier insulating film that inhibits entry of impurities such as water or hydrogen and excess oxygen into the transistor 510C from the insulator 580 side. The insulator 544 can be formed using an insulator that can be used for the insulator 545. In addition, the insulator 544 may be formed using a nitride insulator such as aluminum nitride, aluminum titanium nitride, titanium nitride, silicon nitride, or silicon nitride oxide, for example.

Unlike in the transistor 510A illustrated in FIG. 7, in the transistor 510C illustrated in FIG. 9, the conductor 505 may be provided to have a single-layer structure. In this case, an insulating film to be the insulator 516 is formed over the patterned conductor 505, and an upper portion of the insulating film is removed by a CMP method or the like until the top surface of the conductor 505 is exposed. Preferably, the planarity of the top surface of the conductor 505 is made favorable. For example, the average surface roughness (Ra) of the top surface of the conductor 505 is less than or equal to 1 nm, preferably less than or equal to 0.5 nm, further preferably less than or equal to 0.3 nm. This allows the improvement in planarity of an insulating layer formed over the conductor 505 and the increase in crystallinity of the oxide 530b and the oxide 530c.

<Transistor Structure Example 4>

Figure 10A:
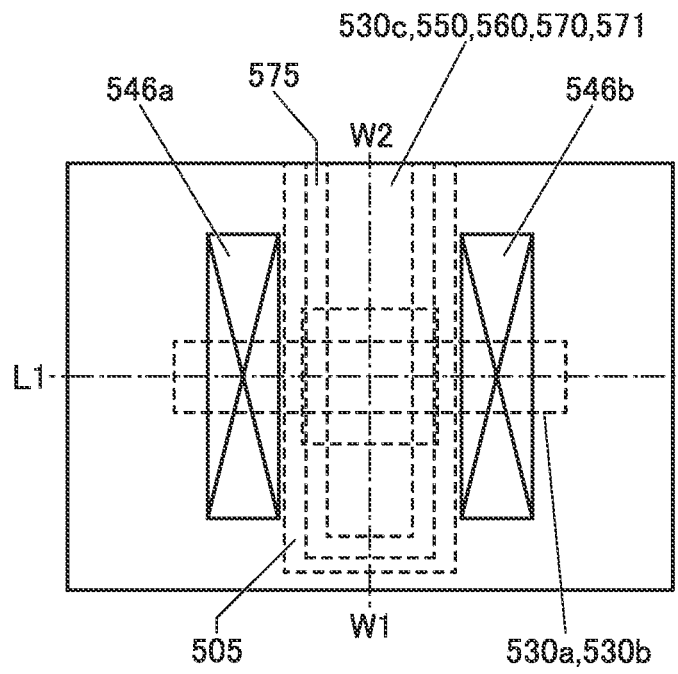
FIG. 10A is a top view illustrating a structure example of a transistor.
Figure 10C:
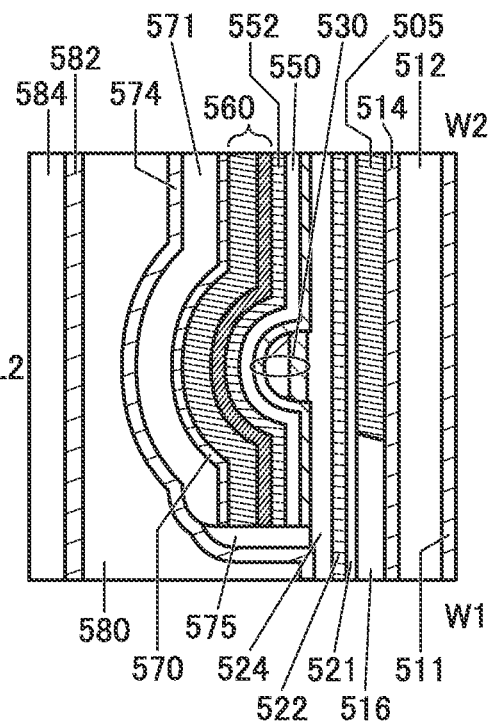
FIG. 10B and FIG. 10C are cross-sectional views illustrating the structure example of the transistor.
Figure 10B:
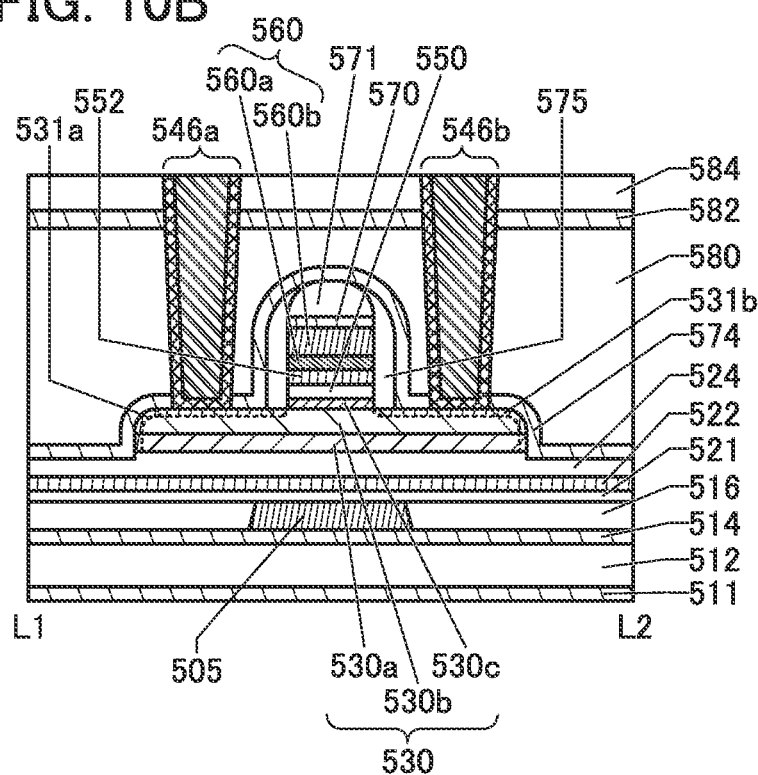

A structure example of a transistor 510D is described with reference to FIG. 10A, FIG. 10B, and FIG. 10C. FIG. 10A is a top view of the transistor 510D. FIG. 10B is a cross-sectional view of a portion indicated by a dashed-dotted line L1-L2 in FIG. 10A. FIG. 10C is a cross-sectional view of a portion indicated by a dashed-dotted line W1-W2 in FIG. 10A. Note that for clarification of the drawing, some components are not illustrated in the top view of FIG. 10A.

The transistor 510D is a variation example of the above transistors. Therefore, differences from the above transistors will be mainly described to avoid repeated description.

In FIG. 10A to FIG. 10C, the conductor 503 is not provided and the conductor 505 that has a function of a second gate is made to function also as a wiring. Furthermore, the insulator 550 is provided over the oxide 530c and a metal oxide 552 is provided over the insulator 550. The conductor 560 is provided over the metal oxide 552, and an insulator 570 is provided over the conductor 560. An insulator 571 is provided over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidization of the conductor 560 due to oxygen can be suppressed.

Note that the metal oxide 552 may function as part of a first gate. For example, an oxide semiconductor that can be used for the oxide 530 can be used for the metal oxide 552. In this case, when the conductor 560 is deposited by a sputtering method, the metal oxide 552 can have a reduced electric resistance to be a conductive layer. This can be called an OC (Oxide Conductor) electrode.

Note that the metal oxide 552 functions as part of a gate insulating film in some cases. Thus, when silicon oxide, silicon oxynitride, or the like is used for the insulator 550, a metal oxide that is a high-k material with a high relative permittivity is preferably used for the metal oxide 552. Such a stacked-layer structure can be thermally stable and can have a high relative permittivity. Thus, a gate potential that is applied during operation of the transistor can be reduced while the physical thickness is maintained. In addition, the equivalent oxide thickness (EOT) of the insulating layer functioning as the gate insulating film can be reduced.

Although the metal oxide 552 in the transistor 510D is shown as a single layer, the metal oxide 552 may have a stacked-layer structure of two or more layers. For example, a metal oxide functioning as part of a gate electrode and a metal oxide functioning as part of the gate insulating film may be stacked.

With the metal oxide 552 functioning as a gate electrode, the on-state current of the transistor 510D can be increased without a reduction in the influence of the electric field from the conductor 560. With the metal oxide 552 functioning as the gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric field applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable since it is less likely to be crystallized by heat treatment in a later step. Note that the metal oxide 552 is not an essential structure. Design is appropriately set in consideration of required transistor characteristics.

For the insulator 570, an insulating material having a function of inhibiting the passage of oxygen and impurities such as water and hydrogen is preferably used. For example, aluminum oxide or hafnium oxide is preferably used. Thus, oxidization of the conductor 560 due to oxygen from above the insulator 570 can be inhibited. Moreover, entry of impurities such as water and hydrogen from above the insulator 570 into the oxide 530 through the conductor 560 and the insulator 550 can be inhibited.

The insulator 571 functions as a hard mask. By providing the insulator 571, the conductor 560 can be processed to have a side surface that is substantially vertical; specifically, an angle formed by the side surface of the conductor 560 and a surface of the substrate can be greater than or equal to 750 and less than or equal to 100°, preferably greater than or equal to 800 and less than or equal to 95°.

An insulating material having a function of inhibiting the passage of oxygen and impurities such as water and hydrogen may be used for the insulator 571 so that the insulator 571 also functions as a barrier layer. In that case, the insulator 570 does not have to be provided.

Parts of the insulator 570, the conductor 560, the metal oxide 552, the insulator 550, and the oxide 530c are selected and removed using the insulator 571 as a hard mask, whereby their side surfaces can be substantially aligned with each other and a surface of the oxide 530b can be partly exposed.

The transistor 510D includes a region 531a and a region 531b on part of the exposed surface of the oxide 530b. One of the region 531a and the region 531b functions as a source region, and the other functions as a drain region.

The region 531a and the region 531b can be formed by addition of an impurity element such as phosphorus or boron to the exposed surface of the oxide 530b by an ion implantation method, an ion doping method, a plasma immersion ion implantation method, or plasma treatment, for example.

In this embodiment and the like, an "impurity element" refers to an element other than main constituent elements.

Alternatively, the region 531a and the region 531b can be formed in such manner that, after part of the surface of the oxide 530b is exposed, a metal film is formed and then heat treatment is performed so that the element contained in the metal film is diffused into the oxide 530b.

The electrical resistivity of regions of the oxide 530b to which the impurity element is added decreases. For that reason, the region 531a and the region 531b are sometimes referred to "impurity regions" or "low-resistance regions".

The region 531a and the region 531b can be formed in a self-aligned manner by using the insulator 571 and/or the conductor 560 as a mask. Accordingly, the conductor 560 does not overlap with the region 531a and/or the region 531b, so that the parasitic capacitance can be reduced. Moreover, an offset region is not formed between a channel formation region and the source/drain region (the region 531a or the region 531b). The formation of the region 531a and the region 531b in a self-aligned manner achieves an increase in on-state current, a reduction in threshold voltage, and an improvement in operating frequency, for example.

Note that an offset region may be provided between the channel formation region and the source/drain region in order to further reduce the off-state current. The offset region is a region where the electrical resistivity is high and a region where the above-described addition of the impurity element is not performed. The offset region can be formed by the above-described addition of the impurity element after the formation of an insulator 575. In this case, the insulator 575 serves as a mask like the insulator 571 or the like. Thus, the impurity element is not added to a region of the oxide 530b overlapped by the insulator 575, so that the electrical resistivity of the region can be kept high.

The transistor 510D includes the insulator 575 on the side surfaces of the insulator 570, the conductor 560, the metal oxide 552, the insulator 550, and the oxide 530c. The insulator 575 is preferably an insulator having a low relative permittivity. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used for the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 510D also includes the insulator 574 over the insulator 575 and the oxide 530. The insulator 574 is preferably deposited by a sputtering method. When a sputtering method is used, an insulator containing few impurities such as water and hydrogen can be deposited. For example, aluminum oxide is preferably used for the insulator 574.

Note that an oxide film obtained by a sputtering method may extract hydrogen from the structure body over which the oxide film is deposited. Thus, the hydrogen concentration in the oxide 530 and the insulator 575 can be reduced when the insulator 574 absorbs hydrogen and water from the oxide 530 and the insulator 575.

<Transistor Structure Example 5>

Figure 11A:
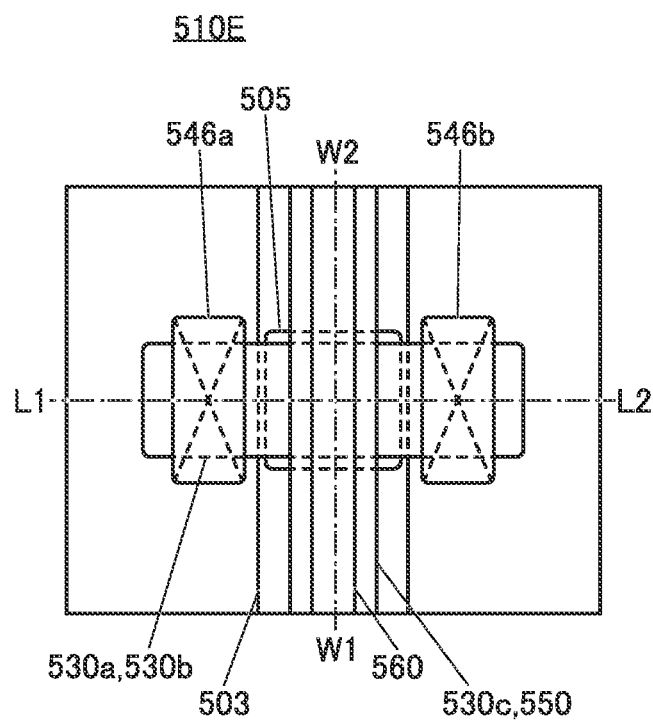
FIG. 11A is a top view illustrating a structure example of a transistor.

A structure example of a transistor 510E is described with reference to FIG. 11A to FIG. 11C. FIG. 11A is a top view of the transistor 510E. FIG. 11B is a cross-sectional view of a portion indicated by a dashed-dotted line L1-L2 in FIG.

11A. FIG. 11C is a cross-sectional view of a portion indicated by a dashed-dotted line W1-W2 in FIG. 11A. Note that for clarification of the drawing, some components are not illustrated in the top view of FIG. 11A.

The transistor 510E is a variation example of the above transistors. Therefore, differences from the above transistors will be mainly described to avoid repeated description.

Figure 11C:
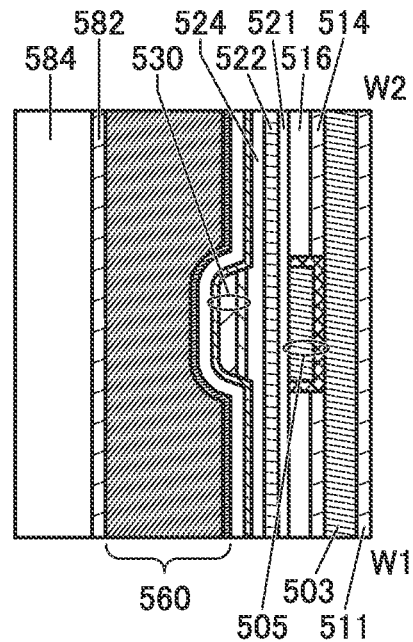
FIG. 11B and FIG. 11C are cross-sectional views illustrating the structure example of the transistor.
Figure 11B:
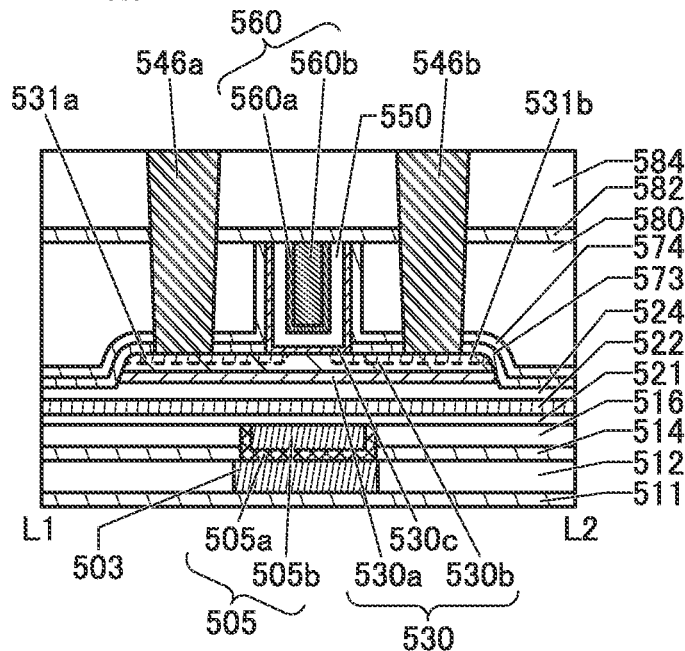

In FIG. 11A to FIG. 11C, the conductor 542 is not provided, and part of the exposed surface of the oxide 530b includes the region 531a and the region 531b. One of the region 531a and the region 531b functions as a source region, and the other functions as a drain region. Moreover, an insulator 573 is included between the oxide 530b and the insulator 574.

The regions 531 (the region 531a and the region 531b) illustrated in FIG. 11 are regions where an element to be described below is added to the oxide 530b. The regions 531 can be formed with the use of a dummy gate, for example.

Specifically, a dummy gate is provided over the oxide 530b, and the above element that reduces the resistance of the oxide 530b is added using the dummy gate as a mask. That is, the element is added to regions of the oxide 530 that are not overlapped by the dummy gate, whereby the regions 531 are formed. As a method of adding the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530 are boron and phosphorus. Moreover, hydrogen, carbon, nitrogen, fluorine, sulfur, chlorine, titanium, a rare gas element, or the like may be used. Typical examples of the rare gas element include helium, neon, argon, krypton, and xenon. The concentration of the element is measured by secondary ion mass spectrometry (SIMS) or the like.

In particular, boron and phosphorus are preferable because an apparatus used in a manufacturing line for amorphous silicon or low-temperature polysilicon can be used. Since the existing facility can be used, capital investment can be reduced.

Next, an insulating film to be the insulator 573 and an insulating film to be the insulator 574 may be formed over the oxide 530b and the dummy gate. Stacking the insulating film to be the insulator 573 and the insulating film to be the insulator 574 can provide a region where the region 531, the oxide 530c, and the insulator 550 overlap with each other.

Specifically, after an insulating film to be the insulator 580 is provided over the insulating film to be the insulator 574, the insulating film to be the insulator 580 is subjected to CMP (Chemical Mechanical Polishing) treatment, whereby part of the insulating film to be the insulator 580 is removed and the dummy gate is exposed. Then, when the dummy gate is removed, part of the insulator 573 in contact with the dummy gate is preferably also removed. Thus, the insulator 574 and the insulator 573 are exposed at a side surface of an opening provided in the insulator 580, and the region 531 provided in the oxide 530b is partly exposed at the bottom surface of the opening. Next, an oxide film to be the oxide 530c, an insulating film to be the insulator 550, and a conductive film to be the conductor 560 are formed in this order in the opening, and then an oxide film to be the oxide 530c, an insulating film to be the insulator 550, and a conductive film to be the conductor 560 are partly removed by CMP treatment or the like until the insulator 580 is exposed; thus, the transistor illustrated in FIG. 11 can be formed.

Note that the insulator 573 and the insulator 574 are not essential components. Design is appropriately set in consideration of required transistor characteristics.

The cost of the transistor illustrated in FIG. 11 can be reduced because an existing apparatus can be used and the conductor 542 is not provided.

<Transistor Structure Example 6>

Figure 12A:
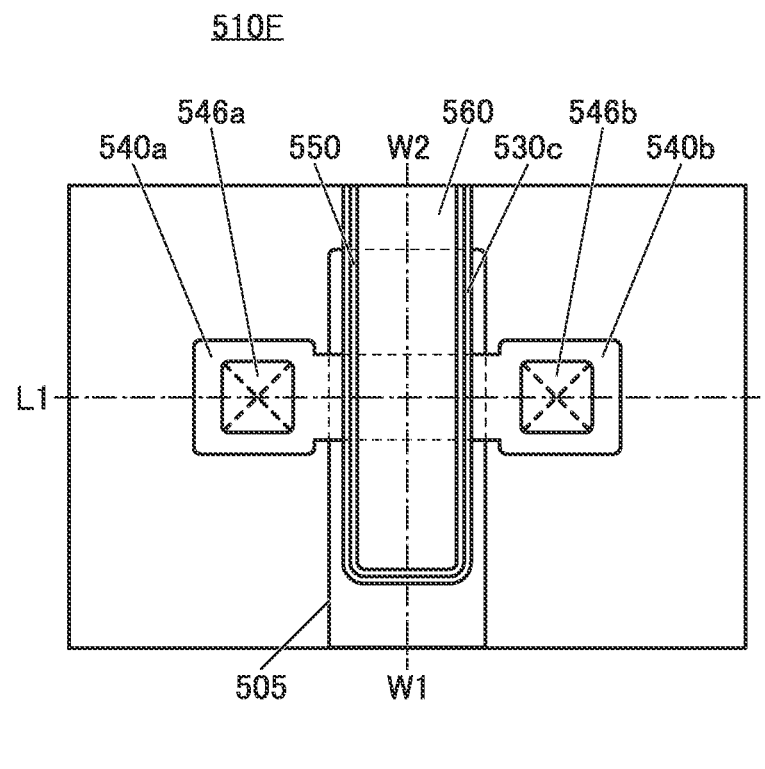
FIG. 12A is a top view illustrating a structure example of a transistor.
Figure 12C:
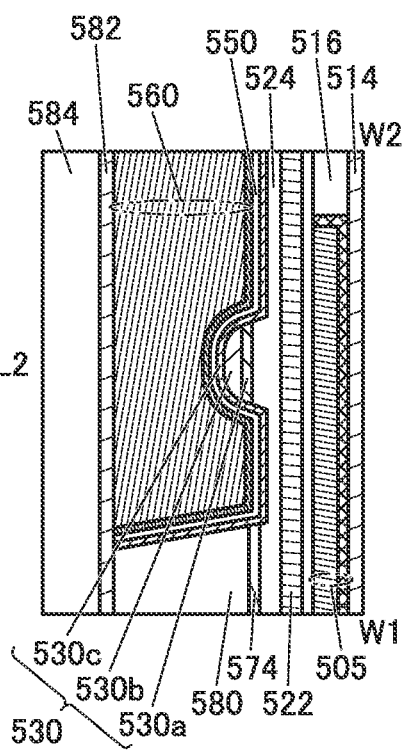
FIG. 12B and FIG. 12C are cross-sectional views illustrating the structure example of the transistor.
Figure 12B:
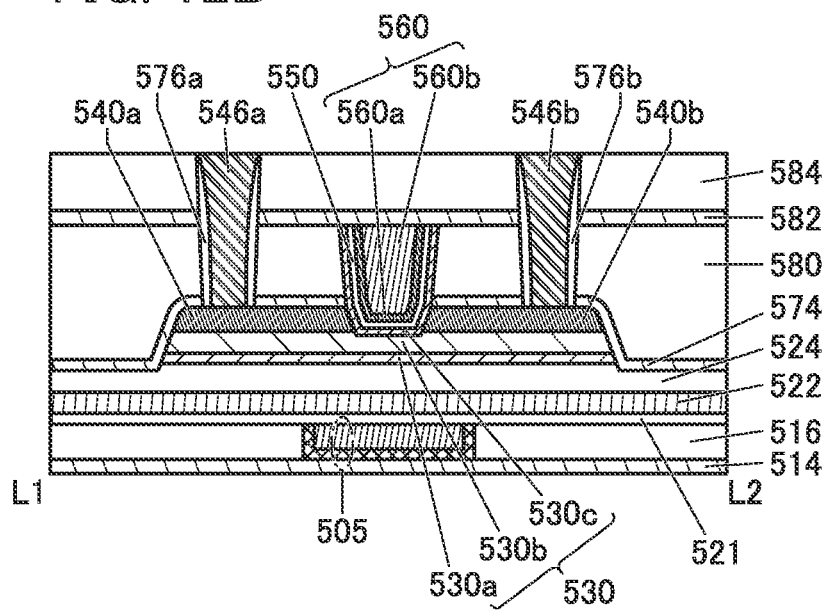

A structure example of a transistor 510F is described with reference to FIG. 12A to FIG. 12C. FIG. 12A is a top view of the transistor 510F. FIG. 12B is a cross-sectional view of a portion indicated by a dashed-dotted line L1-L2 in FIG. 12A. FIG. 12C is a cross-sectional view of a portion indicated by a dashed-dotted line W1-W2 in FIG. 12A. Note that for clarification of the drawing, some components are not illustrated in the top view of FIG. 12A.

The transistor 510F is a variation example of the transistor 510A. Therefore, differences from the above transistors will be mainly described to avoid repeated description.

In the transistor 510A, part of the insulator 574 is provided in the opening provided in the insulator 580 to cover a side surface of the conductor 560. Meanwhile, in the transistor 510F, an opening is formed by partly removing the insulator 580 and the insulator 574.

An insulator 576 (an insulator 576a and an insulator 576b) having a barrier property may be provided between the conductor 546 and the insulator 580. Providing the insulator 576 can prevent oxygen in the insulator 580 from reacting with the conductor 546 and oxidizing the conductor 546.

Note that when an oxide semiconductor is used as the oxide 530, the oxide 530 preferably has a stacked-layer structure of oxides that differ in the atomic ratio of metal atoms. Specifically, the atomic proportion of the element M in constituent elements in the metal oxide used for the oxide 530a is preferably greater than the atomic proportion of the element M in constituent elements in the metal oxide used for the oxide 530b. Moreover, the atomic ratio of the element M to In in the metal oxide used for the oxide 530a is preferably greater than the atomic ratio of the element M to In in the metal oxide used for the oxide 530b. Furthermore, the atomic ratio of In to the element M in the metal oxide used for the oxide 530b is preferably greater than the atomic ratio of In to the element M in the metal oxide used for the oxide 530a. A metal oxide that can be used for the oxide 530a or the oxide 530b can be used for the oxide 530c.

The oxide 530a, the oxide 530b, and the oxide 530c preferably have crystallinity, and in particular, it is preferable to use a CAAC-OS. An oxide having crystallinity, such as a CAAC-OS, has a dense structure with small amounts of impurities and defects (e.g., oxygen vacancies) and high crystallinity. This can inhibit extraction of oxygen from the oxide 530b by the source electrode or the drain electrode. This can reduce extraction of oxygen from the oxide 530b even when heat treatment is performed; hence, the transistor 510F is stable against high temperatures in the manufacturing process (what is called thermal budget).

Note that one or both of the oxide 530a and the oxide 530c may be omitted. The oxide 530 may be a single layer of the oxide 530b. In the case where the oxide 530 is a stack of the oxide 530a, the oxide 530b, and the oxide 530c, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b. In that case, for the oxide 530c, a metal oxide that can be used for the oxide 530a is preferably used. Specifically, the atomic ratio of the element M to the constituent elements in the metal oxide used as the oxide 530c is preferably greater than the atomic ratio of the element M to the constituent elements in the metal oxide used as the oxide 530b. Moreover, the atomic ratio of the element M to In in the metal oxide used as the oxide 530c is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530c.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at an interface between the oxide 530a and the oxide 530b and an interface between the oxide 530b and the oxide 530c is preferably made low.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used for the oxide 530a and the oxide 530c. In addition, the oxide 530c may have a stacked-layer structure. For example, it is possible to employ a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, a stacked-layer structure of an In—Ga—Zn oxide and an oxide that does not contain In may be employed as the oxide 530c.

Specifically, as the oxide 530a, a metal oxide having In:Ga:Zn=1:3:4 [atomic ratio] or In:Ga:Zn=1:1:0.5 [atomic ratio] is used. As the oxide 530b, a metal oxide having In:Ga:Zn=4:2:3 [atomic ratio] or In:Ga:Zn=3:1:2 [atomic ratio] is used. As the oxide 530c, a metal oxide having In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Furthermore, specific examples of the case where the oxide 530c has a stacked-layer structure include a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 510F can have high on-state current and high frequency characteristics. Note that in the case where the oxide 530c has a stacked-layer structure, in addition to the effect of reducing the density of defect states at the interface between the oxide 530b and the oxide 530c, the effect of inhibiting diffusion of the constituent element of the oxide 530c to the insulator 550 side is expected. More specifically, the oxide 530c has a stacked-layer structure and the oxide that does not contain In is positioned at the upper part of the stacked-layer structure, whereby the amount of In that would diffuse to the insulator 550 side can be reduced. Since the insulator 550 functions as the gate insulator, the transistor has defects in characteristics when In diffuses. Thus, when the oxide 530c has a stacked-layer structure, a highly reliable semiconductor device can be provided. A metal oxide functioning as an oxide semiconductor is preferably used as the oxide 530. For example, as the metal oxide to be the channel formation region in the oxide 530, a metal oxide having a bandgap of 2 eV or more, preferably 2.5 eV or more is preferably used. With the use of a metal oxide having such a wide bandgap, the off-state current of the transistor can be reduced. With the use of such a transistor, a semiconductor device with low power consumption can be provided.

<Transistor Structure Example 7>

Although FIG. 5 and FIG. 6 illustrate a structure example in which the conductor 560 that has a function of a gate is formed in an opening in the insulator 580, a structure in which the insulator is provided above the conductor can be employed, for example. A structure example of such a transistor is illustrated in FIG. 13 and FIG. 14.

Figure 13A:
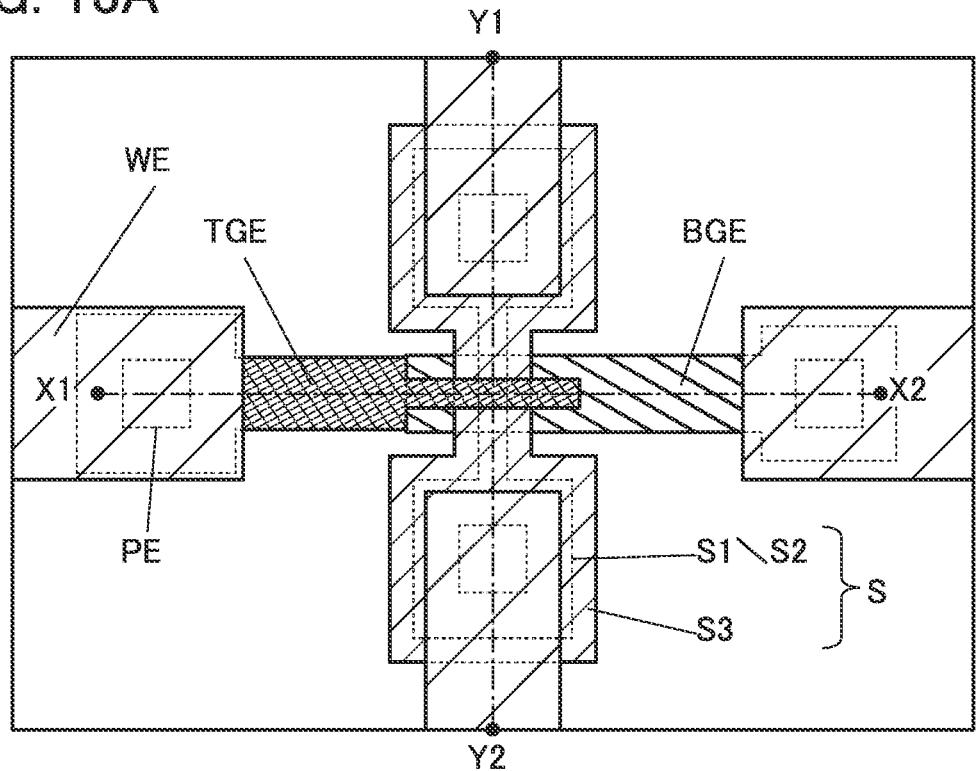
FIG. 13A is a top view illustrating a structure example of a transistor.
Figure 13B:
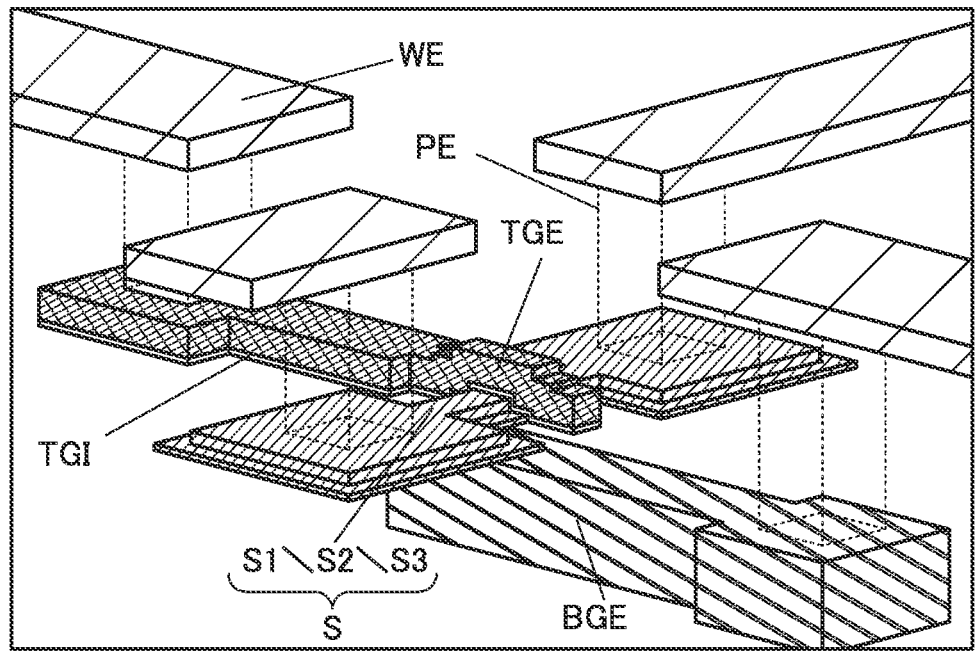
FIG. 13B is a perspective view illustrating the structure example of the transistor.
Figure 14A:
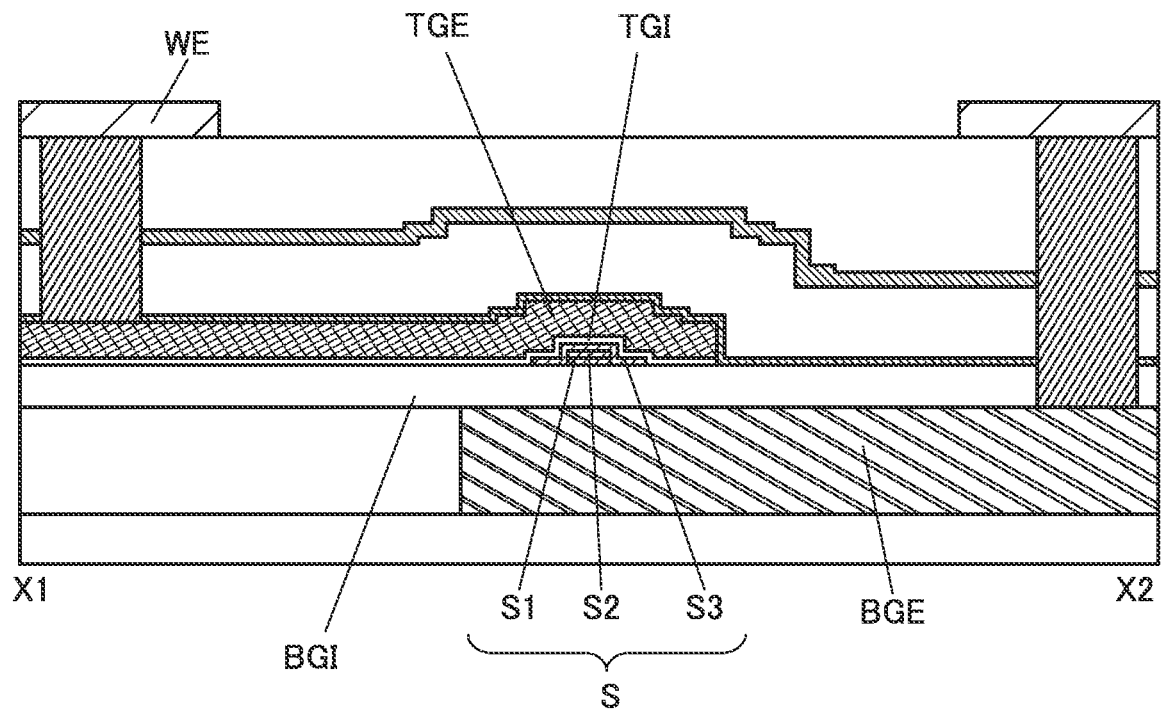
FIG. 14A and FIG. 14B are cross-sectional views illustrating a structure example of a transistor.
Figure 14B:
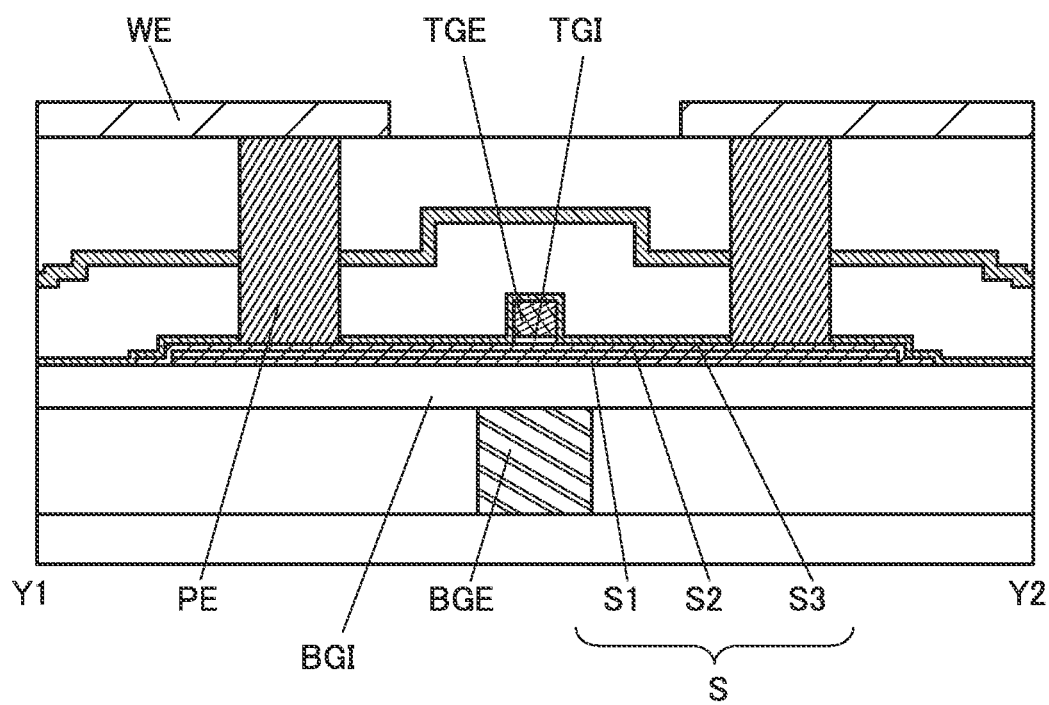

FIG. 13A is a top view of a transistor and FIG. 13B is a perspective view of the transistor. FIG. 14A is a cross-sectional view taken along X1-X2 in FIG. 13A, and FIG. 14B is a cross-sectional view taken along Y1-Y2 in FIG. 13A.

The transistor illustrated in FIG. 13 and FIG. 14 includes a conductor BGE having a function of a back gate, an insulator BGI having a function of a gate insulating film, an oxide semiconductor S, an insulator TGI having a function of a gate insulating film, a conductor TGE having a function of a front gate, and a conductor WE having a function of a wiring. A conductor PE has a function of a plug for connecting the conductor WE to the oxide S, the conductor BGE, or the conductor TGE. Note that an example in which the oxide semiconductor S includes three layers of oxides S1, S2, and S3 is shown here.

<Electrical Characteristics of Transistors>

Next, electrical characteristics of an OS transistor will be described below. A transistor including a first gate and a second gate is described below as an example. In the transistor including the first gate and the second gate, the threshold voltage can be controlled by applying different potentials to the first gate and the second gate. For example, by applying a negative potential to the second gate, the threshold voltage of the transistor can be higher than 0 V and the off-state current can be reduced. That is, when a negative potential is applied to the second gate electrode, drain current when the potential applied to the first electrode is 0 V can be reduced.

When impurity such as hydrogen is added to an oxide semiconductor, the carrier density is increased in some cases. For example, hydrogen added to an oxide semiconductor reacts with oxygen bonded to a metal atom to be water, so that an oxygen vacancy is formed in some cases. Entry of hydrogen into the oxygen vacancy increases carrier density. Furthermore, in some cases, bonding of part of hydrogen to oxygen bonded to a metal atom causes generation of an electron serving as a carrier. That is, the oxide semiconductor to which an impurity such as hydrogen is added becomes n-type and has a reduced resistance.

Therefore, the resistance of the oxide semiconductor can be selectively reduced. That is, a region which has a low carrier density and functions as a semiconductor functioning as a channel formation region and a low-resistance region which has a high carrier density and functions as a source region or a drain region can be provided in the oxide semiconductor.

Here, evaluated is the influence of the structure of a low-resistance region and a high-resistance region provided in the oxide semiconductor on electrical characteristics of the transistor in the case where different potentials are applied to the first gate and the second gate.

[Structure of Transistor]

Figure 15A:
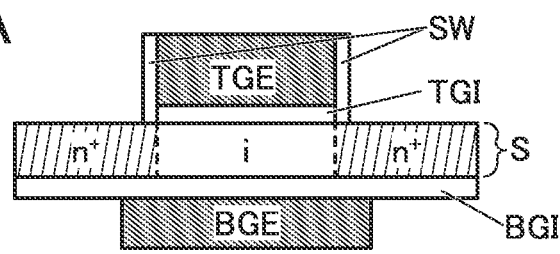
FIG. 15A and FIG. 15C are cross-sectional views of transistors.
Figure 15B:
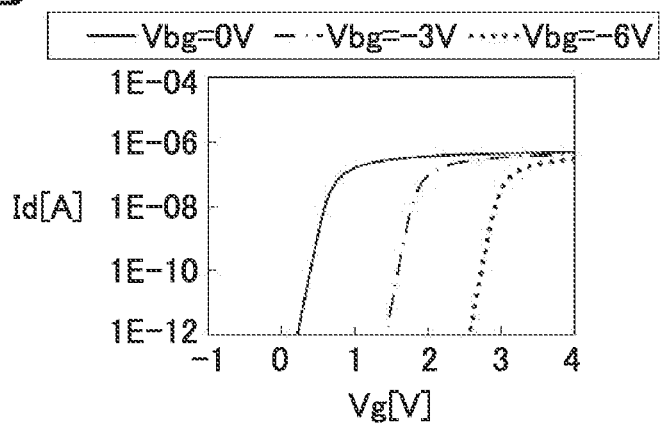
FIG. 15B and FIG. 15D are graphs showing electrical characteristics of the transistors.
Figure 15C:
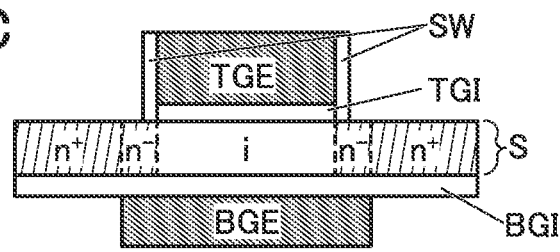

FIG. 15A and FIG. 15C are each a cross-sectional view of a transistor used for the electrical characteristics evaluation. Note that for clarification of the drawings, some components are not illustrated in FIG. 15A and FIG. 15C.

The transistor illustrated in FIG. 15A and FIG. 15C includes a conductor TGE that functions as a first gate, an insulator TGI that functions as a first gate insulating film, an insulator SW that functions as a sidewall provided on a side surface of the first gate, an oxide semiconductor S, a conductor BGE that functions as a second gate, and an insulator BGI that functions as a second gate insulating film. The insulator BGI has a three-layer structure formed of a first layer in contact with the conductor BGE, a second layer over the first layer, and a third layer over the second layer. Note that the third layer is in contact with the oxide semiconductor S.

Here, the oxide semiconductor S included in the transistor illustrated in FIG. 15A has an $n^+$ region and an i region overlapping with the conductor TGE. On the other hand, the oxide semiconductor S included in the transistor illustrated in FIG. 15C has the $n^+$ region, the i region overlapping with the conductor TGE, and an $n^-$ region between the $n^+$ region and the i region.

Note that the $n^+$ region functions as a source region or a drain region and has a high carrier density and reduced resistance. The i region functions as a channel formation region and is a high-resistance region whose carrier density is lower than the $n^+$ region. The $n^-$ region has a lower carrier density than the $n^+$ region and a higher carrier density than the i region.

Although not illustrated, the $n^+$ region of the oxide semiconductor S is in contact with an S/D electrode functioning as a source or a drain.

[Results of Electrical Characteristics Evaluation]

The Id-Vg characteristics of the transistor illustrated in FIG. 15A and the transistor illustrated in FIG. 15C are calculated to evaluate electrical characteristics of the transistors.

Here, as an index of the electrical characteristics of a transistor, the amount of change (hereinafter also referred to as ΔVsh) in the threshold voltage (hereinafter also referred to as Vsh) of the transistor is used. Note that in the Id-Vg characteristics, Vsh is defined as the value of Vg when $Id=1.0\times10^{-12}$ [A] is satisfied.

Note that the Id-Vg characteristics are fluctuation characteristics of current between the source and the drain (hereinafter also referred to as drain current (Id)) when a potential applied to the conductor TGE functioning as a first gate of the transistor (hereinafter also referred to as a gate potential (Vg)) is changed from a first value to a second value.

Here, evaluated are changes in drain current (Id) when a potential between a source and a drain (hereinafter also referred to as a drain potential Vd) is set to +0.1 V and a potential between the source and the conductor TGE functioning as a first gate is changed from −1 V to +4 V.

A device simulator "ATLAS" developed by Silvaco Inc. is used for the calculation. The following table lists parameters used for the calculation. Note that Eg represents an energy gap, Nc represents the effective density of states in the conduction band, and Nv represents the effective density of states in the valence band.

TABLE 1

| Software | | Atlas 2D, Silvaco, Inc. | |
| --- | --- | --- | --- |
| Structure | | Channel length (L) | 350 nm |
| | | Channel width (W) | 350 nm |
| | BGE | Work function | 5.0 eV |
| | | Thickness (wiring) | 20 nm |
| | | Length in L-direction | 510 nm |
| | BGI 3rd layer | Relative permittivity | 4.1 |
| | | Thickness | 10 nm |
| | 2$^{nd}$ layer | Relative permittivity | 16.4 |
| | | Thickness | 10 nm |
| | 1$^{st}$ layer | Relative permittivity | 4.1 |
| | | Thickness | 10 nm |
| | OS | Electron affinity | 4.5 eV |
| | | Eg | 2.9 eV |
| | | Relative permittivity | 15 |
| | | Electron mobility | 20 cm$^2$/Vs |
| | | Hole mobility | 0.01 cm$^2$/Vs |
| | | Nc | 5E+18 cm$^{-3}$ |
| | | Nv | 5E+18 cm$^{-3}$ |
| | | Thickness | 15 nm |
| | n+ region | Length in L-direction | 655 or 700 nm |
| | | Carrier concentration | 5E+18 cm$^{-3}$ |
| | n− region | Length in L-direction | 45 or 0 nm |
| | | Carrier concentration | 1E+17 cm$^{-3}$ |
| | TGI | Relative permittivity | 4.1 |
| | | Thickness | 10 nm |
| | SW | Relative permittivity | 4.1 |
| | | Width | 15 nm |
| | TGE | Work function | 5.0 eV |
| | | Thickness | 20 nm |
| | | Length in L-direction | 350 nm |
| | S/D electrode | Work function | 4.5 eV |

In the transistor illustrated in FIG. 15A, one of the $n^+$ regions is set to 700 nm, and one of the $n^-$ regions is set to 0 nm. In the transistor illustrated in FIG. 15C, one of the $n^+$ regions is set to 655 nm and one of the $n^-$ regions is set to 45 nm. Each of the transistor illustrated in FIG. 15A and the transistor illustrated in FIG. 15C has a structure in which the second gate is larger than the i region. Note that in this evaluation, a potential of the conductor BGE functioning as a second gate (hereinafter also referred to as a backgate potential (Vbg)) is set to 0.00 V, −3.00 V, or −6.00 V.

FIG. 15B shows the results of the Id-Vg characteristics obtained by the calculation of the transistor illustrated in FIG. 15A. The amount of change in the threshold voltage (ΔVsh) of the transistor when the backgate potential is set to −3.00 V is +1.2 V as compared with that when the backgate potential is set to 0.00 V. The amount of change in the threshold voltage (ΔVsh) of the transistor when the backgate potential is set to −6.00 V is +2.3 V as compared with that when the backgate potential is set to 0.00 V. That is, the amount of change in the threshold voltage (ΔVsh) of the transistor when the backgate potential is set to −6.00 V is +1.1 V as compared with that when the backgate potential is set to −3.00 V. Therefore, even when (the absolute value of) the potential of the conductor BGE functioning as a second gate is made higher, the amount of change in the threshold voltage of the transistor is hardly changed. In addition, even when (the absolute value of) the backgate potential is made higher, there is no change in the rising characteristics.

Figure 15D:
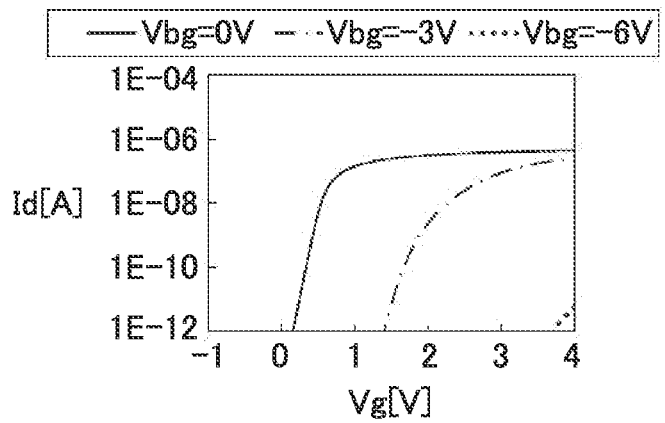

FIG. 15D shows the results of the Id-Vg characteristics obtained by the calculation of the transistor illustrated in FIG. 15C. The amount of change in the threshold voltage (ΔVsh) of the transistor when the backgate potential is set to −3.00 V is +1.2 V as compared with that when the backgate potential is set to 0.00 V. The amount of change in the threshold voltage (ΔVsh) of the transistor when the backgate potential is set to −6.00 V is +3.5 V as compared with that when the backgate potential is set to 0.00 V. That is, the amount of change in the threshold voltage (ΔVsh) of the transistor when the backgate potential is set to −6.00 V is +2.3 V as compared with that when the backgate potential is set to −3.00 V. Therefore, as (the absolute value of) the potential of the conductor BGE functioning as a second gate is made higher, the amount of change in the threshold voltage of the transistor becomes larger. As (the absolute value of) the backgate potential is made higher, the rising characteristics become worse.

As described above, it is found that in the transistor illustrated in FIG. 15C, as (the absolute value of) the potential of the conductor BGE functioning as a second gate is made higher, the amount of change in the threshold voltage of the transistor becomes larger. By contrast, in the transistor illustrated in FIG. 15A, the amount of change in the threshold voltage of the transistor is hardly changed even when (the absolute value of) the potential of the conductor BGE functioning as a second gate is made higher.

Note that this embodiment can be implemented in combination with the other embodiments described in this specification as appropriate.

Embodiment 3

In this embodiment, the composition of a metal oxide that can be used in the OS transistor described in the above embodiment will be described.

<Composition of Metal Oxide>

Note that in this specification and the like, CAAC (c-axis aligned crystal) and CAC (Cloud-Aligned Composite) might be stated. Note that CAAC refers to an example of a crystal structure, and CAC refers to an example of a function or a material composition.

A CAC-OS or a CAC-metal oxide has a conducting function in a part of the material and an insulating function in another part of the material, and has a function of a semiconductor as the whole material. Note that in the case where the CAC-OS or the CAC-metal oxide is used in a channel formation region of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. Moreover, the conductive regions are sometimes observed to be coupled in a cloud-like manner with their boundaries blurred.

Furthermore, in the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different band gaps. For example, the CAC-OS or the CAC-metal oxide is composed of a component having a wide gap due to the insulating region and a component having a narrow gap due to the conductive region. In the case of the structure, when carriers flow, the carriers mainly flow in the component having a narrow gap. Moreover, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in an on state can achieve high current driving capability, that is, high on-state current and high field-effect mobility.

In other words, the CAC-OS or the CAC-metal oxide can also be referred to as a matrix composite or a metal matrix composite.

<Structure of Metal Oxide>

Oxide semiconductors are classified into a single-crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

As an oxide semiconductor used for a semiconductor of the transistor, a thin film having high crystallinity is preferably used. With the use of the thin film, the stability or the reliability of the transistor can be improved. Examples of the thin film include a thin film of a single-crystal oxide semiconductor and a thin film of a polycrystalline oxide semiconductor. However, for forming the thin film of a single-crystal oxide semiconductor or the thin film of a polycrystalline oxide semiconductor over a substrate, a high-temperature process or a laser heating process is needed. Thus, the manufacturing cost is increased, and in addition, the throughput is decreased.

Non-Patent Document 1 and Non-Patent Document 2 have reported that an In—Ga—Zn oxide having a CAAC structure (referred to as CAAC-IGZO) was found in 2009. It has been reported that CAAC-IGZO has c-axis alignment, a crystal grain boundary is not clearly observed, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 3). It has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown a change in average crystal size due to electron beam irradiation to thin films of the above CAAC-IGZO, the above nc-IGZO, and IGZO having low crystallinity. In the thin film of IGZO having low crystallinity, crystalline IGZO with a crystal size of approximately 1 nm was observed even before the electron beam irradiation. Thus, it has been reported that the existence of a completely amorphous structure was not observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for a semiconductor of a transistor.

The CAAC-OS has c-axis alignment, a plurality of nanocrystals are connected in the a-b plane direction, and the crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited due to the distortion of lattice arrangement. This is probably because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is an oxide semiconductor with high crystallinity. By contrast, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including a CAAC-OS is resistant to heat and has high reliability. In addition, the CAAC-OS is stable with respect to high temperature in the manufacturing process (what is called thermal budget). Accordingly, the use of the CAAC-OS for the OS transistor can extend a degree of freedom of the manufacturing process.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor depending on the analysis method.

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor has various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

Note that when the above oxide semiconductor is used for a transistor, the transistor having high field-effect mobility can be achieved. In addition, the transistor having high reliability can be achieved.

Non-Patent Document 6 shows that the transistor using an oxide semiconductor has extremely low leakage current in a non-conduction state; specifically, the off-state current per micrometer in the channel width of the transistor is of the order of yA/μm ($10^{-24}$ A/μm). For example, a low-power-consumption CPU utilizing a characteristic of low leakage current of the transistor using an oxide semiconductor is disclosed (see Non-Patent Document 7).

Furthermore, application of a transistor using an oxide semiconductor to a display device that utilizes the characteristic of low leakage current of the transistor has been reported (see Non-Patent Document 8). In the display device, a displayed image is changed several tens of times per second. The number of times an image is changed per second is called a refresh rate. The refresh rate is also referred to as driving frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate enables the power consumption of the display device to be reduced. Such a driving method is referred to as idling stop (IDS) driving.

Furthermore, an oxide semiconductor with a low carrier density is preferably used for the transistor. In the case where the carrier density of an oxide semiconductor film is reduced, the impurity concentration in the oxide semiconductor film is reduced to reduce the density of defect states. In this specification and the like, a state with a low impurity concentration and a low density of defect states is referred to as a highly purified intrinsic or substantially highly purified intrinsic state.

Moreover, a highly purified intrinsic or substantially highly purified intrinsic oxide semiconductor film has a low density of defect states and accordingly may have a low density of trap states. Note that the carrier density of an oxide semiconductor that can be used in one embodiment of the present invention is set in the range described in Embodiment 2.

Charges trapped by the trap states in the oxide semiconductor take a long time to be released and may behave like fixed charges. Thus, a transistor whose channel formation region is formed in an oxide semiconductor having a high density of trap states has unstable electrical characteristics in some cases.

Accordingly, in order to obtain stable electrical characteristics of the transistor, it is effective to reduce the concentration of impurities in the oxide semiconductor. In addition, in order to reduce the concentration of impurities in the oxide semiconductor, the impurity concentration in an adjacent film is also preferably reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon that is a Group 14 element is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration measured by secondary ion mass spectrometry (SIMS)) are set to lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated, in some cases. Thus, a transistor using an oxide semiconductor that contains an alkali metal or an alkaline earth metal is likely to have normally-on characteristics. Therefore, it is preferable to reduce the concentration of an alkali metal or an alkaline earth metal in the oxide semiconductor. Specifically, the concentration of an alkali metal or an alkaline earth metal in the oxide semiconductor obtained by SIMS is set to lower than or equal to $1 \times 10^{18}$ atoms/cm$^3$, preferably lower than or equal to $2 \times 10^{16}$ atoms/cm$^3$.

Furthermore, when containing nitrogen, the oxide semiconductor easily becomes n-type by generation of electrons serving as carriers and an increase in carrier density. As a result, a transistor using an oxide semiconductor containing nitrogen is likely to have normally-on characteristics. Thus, nitrogen in the oxide semiconductor is preferably reduced as much as possible; for example, the nitrogen concentration in the oxide semiconductor is set to lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$ in SIMS.

Furthermore, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor obtained by SIMS is lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

When an oxide semiconductor with sufficiently reduced impurities is used for a channel formation region of a transistor, stable electrical characteristics can be given.

The discovery of the CAAC structure and the nc structure has contributed to an improvement in electrical characteristics and reliability of a transistor using an oxide semiconductor having the CAAC structure or the nc structure, a reduction in manufacturing cost, and an improvement in throughput. Furthermore, applications of the transistor to a display device and an LSI utilizing the characteristics of low leakage current of the transistor have been studied.

Note that this embodiment can be implemented in combination with the other embodiments described in this specification as appropriate.

REFERENCE NUMERALS

B11: secondary battery:, :B11_1: :secondary battery:, ::B11_2: :secondary battery:, :CM0_IN: input terminal:, :CM1_IN: input terminal:, :CM0_OUT: output terminal:, :CP0_IN: input terminal:, :CP0_OUT: output terminal:, :CP1_IN: input terminal:, :CP1_OUT: output terminal:, :N11: node:, :N12: node:, :N13: node:, :R1: resistor:, :R12: resistor:, :R21: resistor:, :R22: resistor:, :S1: oxide:, :VB1_IN: wiring:, :VB2_IN: wiring:, :VD1: high power supply potential:, :VD1_IN: wiring:, :VD2: high power supply potential:, :VD2_IN: wiring:, :11: transistor:, :12: transistor:, :13: transistor:, :14: transistor:, :15: transistor:, :21: transistor:, :22: transistor:, :23: transistor:, :24: transistor:, :25: transistor:, :26: transistor:, :27: transistor:, :28: transistor:, :29: transistor:, :50: comparator:, :51: amplifier:, :100: semiconductor device:, :110: anomaly detection circuit:, :110_1: anomaly detection circuit:, :110_2: anomaly detection circuit:, :300: transistor:, :311: substrate:, :313: semiconductor region:, :314a: low-resistance region:, :314b: low-resistance region:, :315: insulator:, :316: conductor:, :320: insulator:, :322: insulator:, :324: insulator:, :326: insulator:, :328: conductor:, :330: conductor:, :350: insulator:, :352: insulator:, :354: insulator:, :356: conductor:, :360: insulator:, :362: insulator:, :364: insulator:, :366: conductor:, :370: insulator:, :372: insulator:, :374: insulator:, :376: conductor:, :380: insulator:, :382: insulator:, :384: insulator:, :386: conductor:, :500: transistor:, :503: conductor:, :503a: conductor:, :503b: conductor:, :505: conductor:, :505a: conductor:, :505b: conductor:, :510: insulator:, :510A: transistor:, :510B: transistor:, :510C: transistor:, :510D: transistor:, :510E: transistor:, :510F: transistor:, :511: insulator:, :512: insulator:, :514: insulator:, :516: insulator:, :518: conductor:, :520: insulator:, :521: insulator:, :522: insulator:, :524: insulator:, :530: oxide:, :530a: oxide:, :530b: oxide:, :530c: oxide:, :531: region:, :531a: region:, :531b: region:, :540a: conductor:, :540b: conductor:, :542: conductor:, :542a: conductor:, :542b: conductor:, :543: region:, :543a: region:, :543b: region:, :544: insulator:, :545: insulator:, :546: conductor:, :546a: conductor:, :546b: conductor:, :547: conductor:, :547a: conductor:, :547b: conductor:, :548: conductor:, :550: insulator:, :552: metal oxide:, :560: conductor:, :560a: conductor:, :560b: conductor:, :570: insulator:, :571: insulator:, :573: insulator:, :574: insulator:, :575: insulator:, :576: insulator:, :576a: insulator:, :576b: insulator:, :580: insulator:, :581: insulator:, :582: insulator:, :584: insulator:, :586: insulator:, :600: capacitor:, :610: conductor:, :612: conductor:, :620: conductor:, :630: insulator:, :650: insulator

The invention claimed is:
1. A semiconductor device comprising:
a first source follower;
a second source follower; and
a comparator,
wherein the first source follower is supplied with a second high power supply potential and a low power supply potential,
wherein the second source follower is supplied with a first high power supply potential and the low power supply potential, wherein the comparator is supplied with the first high power supply potential and the low power supply potential, wherein the first high power supply potential is a potential higher than the low power supply potential, wherein the second high power supply potential is a potential higher than the first high power supply potential, wherein a digital signal which expresses a high level or a low level using the second high power supply potential or the first high power supply potential is input to the first source follower, wherein the comparator compares an output potential of the first source follower and an output potential of the second source follower, and wherein the comparator outputs a digital signal which expresses a high level or a low level using the first high power supply potential or the low power supply potential.

2. The semiconductor device according to claim 1, wherein each of a first transistor included in the first source follower, a second transistor included in the second source follower, and a third transistor included in the comparator is an n-channel transistor.

3. The semiconductor device according to claim 1, wherein each of a first transistor included in the first source follower, a second transistor included in the second source follower, and a third transistor included in the comparator comprises a metal oxide in a channel formation region.

4. A semiconductor device comprising:
a first source follower;
a second source follower; and
a comparator, wherein the first source follower is supplied with a second high power supply potential and a low power supply potential, wherein the second source follower is supplied with a first high power supply potential and the low power supply potential, wherein the comparator is supplied with the first high power supply potential and the low power supply potential, wherein the first high power supply potential is a potential higher than the low power supply potential, wherein the second high power supply potential is a potential higher than the first high power supply potential, wherein a digital signal which expresses a high level or a low level using the second high power supply potential or the first high power supply potential is input to the first source follower, wherein in the case where an output potential of the first source follower is higher than an output potential of the second source follower, the comparator outputs the first high power supply potential, and wherein in the case where the output potential of the first source follower is lower than the output potential of the second source follower, the comparator outputs the low power supply potential.

5. The semiconductor device according to claim 4, wherein each of a first transistor included in the first source follower, a second transistor included in the second source follower, and a third transistor included in the comparator is an n-channel transistor.

6. The semiconductor device according to claim 4, wherein each of a first transistor included in the first source follower, a second transistor included in the second source follower, and a third transistor included in the comparator comprises a metal oxide in a channel formation region.

7. A semiconductor device comprising:
a first source follower;
a second source follower; and
a comparator, wherein the first source follower is supplied with a second high power supply potential and a low power supply potential, wherein the second source follower is supplied with a first high power supply potential and the low power supply potential, wherein the comparator is supplied with the first high power supply potential and the low power supply potential, wherein the first high power supply potential is a potential higher than the low power supply potential, wherein the second high power supply potential is a potential higher than the first high power supply potential, wherein a digital signal which expresses a high level or a low level using the second high power supply potential or the first high power supply potential is input to the first source follower, wherein a predetermined potential is input to the second source follower, wherein in the case where an output potential of the first source follower is higher than an output potential of the second source follower, the comparator outputs the first high power supply potential, and wherein in the case where the output potential of the first source follower is lower than the output potential of the second source follower, the comparator outputs the low power supply potential.

8. The semiconductor device according to claim 7, wherein each of a first transistor included in the first source follower, a second transistor included in the second source follower, and a third transistor included in the comparator is an n-channel transistor.

9. The semiconductor device according to claim 7, wherein each of a first transistor included in the first source follower, a second transistor included in the second source follower, and a third transistor included in the comparator comprises a metal oxide in a channel formation region.

* * * * *